US009632374B2

(12) United States Patent
Murakami

(10) Patent No.: US 9,632,374 B2
(45) Date of Patent: Apr. 25, 2017

(54) OVERVOLTAGE PROTECTION CIRCUIT, POWER SUPPLY DEVICE, LIQUID CRYSTAL DISPLAY DEVICE, ELECTRONIC DEVICE AND TELEVISION SET

(75) Inventor: Kazuhiro Murakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 553 days.

(21) Appl. No.: 14/129,582

(22) PCT Filed: Jun. 11, 2012

(86) PCT No.: PCT/JP2012/064880
§ 371 (c)(1),
(2), (4) Date: Dec. 27, 2013

(87) PCT Pub. No.: WO2013/005529
PCT Pub. Date: Jan. 10, 2013

(65) Prior Publication Data
US 2014/0146426 A1    May 29, 2014

(30) Foreign Application Priority Data

Jul. 1, 2011 (JP) .................................. 2011-147294
Jul. 13, 2011 (JP) .................................. 2011-154882
Jul. 26, 2011 (JP) .................................. 2011-162999

(51) Int. Cl.
*G02F 1/1362* (2006.01)
*H03K 19/003* (2006.01)
(Continued)

(52) U.S. Cl.
CPC ........ *G02F 1/136204* (2013.01); *H02H 9/043* (2013.01); *H03K 19/00315* (2013.01); *H01L 27/0251* (2013.01)

(58) Field of Classification Search
CPC .................................. H02H 3/00; H02H 9/04
(Continued)

(56) References Cited

U.S. PATENT DOCUMENTS

2002/0060893 A1* 5/2002 Min ....................... H02H 3/202
                                                        361/91.1
2003/0214769 A1* 11/2003 Nishikawa .......... H01L 27/0266
                                                        361/56
(Continued)

FOREIGN PATENT DOCUMENTS

JP          06-086459           3/1994
JP          07-099064 A         4/1995
(Continued)

OTHER PUBLICATIONS

Japanese Patent Office, International Search Report for International Patent Application PCT/JP2012/064880, with English translation (Jun. 11, 2012).

*Primary Examiner* — Dharti Patel
(74) *Attorney, Agent, or Firm* — Fish & Richardson P.C.

(57) ABSTRACT

An overvoltage protection portion (14) includes a transistor (P1) that achieves continuity with an input voltage (VIN) used as an output voltage (VOUT) to an internal circuit when the input voltage (VIN) applied to an external terminal (T1) is not in an overvoltage state. The overvoltage protection portion (14) also includes: a transistor (P2) operating as a short circuit that short-circuits the source and the gate of the transistor (P1) and that interrupts the input voltage (VIN) when the input voltage (VIN) is in the overvoltage state; a resistor (R2); and a Zener diode (ZD1). The overvoltage protection portion (14) also includes: a transistor (NTr1) operating as a bypass circuit that supplies a constant output voltage (VOUT) from the external terminal (T1) to the internal circuit when the input voltage (VIN) is brought into the overvoltage state; a resistor (R3); and a Zener diode (ZD2).

3 Claims, 17 Drawing Sheets

(51) Int. Cl.
*H02H 9/04* (2006.01)
*H01L 27/02* (2006.01)

(58) Field of Classification Search
USPC .......................................... 361/91.1
See application file for complete search history.

(56) References Cited

U.S. PATENT DOCUMENTS

| | | |
|---|---|---|
| 2007/0121263 A1 | 5/2007 | Liu et al. |
| 2007/0290660 A1* | 12/2007 | Yamazaki ............... G05F 1/613 323/222 |
| 2007/0291432 A1 | 12/2007 | Ueda |
| 2008/0001887 A1 | 1/2008 | Hong et al. |
| 2009/0121782 A1 | 5/2009 | Oyama et al. |
| 2010/0271739 A1 | 10/2010 | Hirata |
| 2010/0308655 A1 | 12/2010 | Wachi et al. |

FOREIGN PATENT DOCUMENTS

| | | |
|---|---|---|
| JP | 2003-303890 | 10/2003 |
| JP | 2007-151065 | 6/2007 |
| JP | 2007-158083 | 6/2007 |
| JP | 2008-009364 | 1/2008 |
| JP | 2008-191687 | 8/2008 |
| JP | 2009-124827 | 6/2009 |
| JP | 2010-278419 | 12/2010 |
| JP | 2010-283950 | 12/2010 |

* cited by examiner

OVERVOLTAGE PROTECTION CIRCUIT, POWER SUPPLY DEVICE, LIQUID CRYSTAL DISPLAY DEVICE, ELECTRONIC DEVICE AND TELEVISION SET

TECHNICAL FIELD

First Technical Field

A first invention of various inventions disclosed in the present specification relates to an overvoltage protection circuit and a semiconductor device formed by integrating such an overvoltage protection circuit.

Second Technical Field

A second invention of the various inventions disclosed in the present specification relates to a step-up power supply device.

Third Technical Field

A third invention of the various inventions disclosed in the present specification relates to a power supply circuit and a liquid crystal display device incorporating such a power supply circuit.

BACKGROUND ART

Background Art Related to the First Invention

In recent years, ICs (integrated circuits) have been required to have resistance to an instantaneous surge voltage such as an EOS (electrical overstress). For example, when a low-voltage resistant element within an IC is only resistant to up to a voltage of 7 V, and a surge voltage of 20 to 30 V is likely to be applied for a few milliseconds, it is required to cope with this surge voltage.

In a conventional technology, for example, an anti-ESD (electrostatic discharge) element such as a varistor is added to the outside of an IC or a high-voltage resistant LDO (low drop out) chip is provided in the preceding stage of the IC, and thus a predetermined voltage or more is prevented from being applied to the input terminal of the IC. Alternatively, all the interior of the IC is formed with high-voltage resistant elements, and thus resistance to the surge voltage is provided.

A technology is also designed in which a high-voltage resistant emitter follower circuit is provided within the IC, and thus the surge voltage is prevented from being applied to a low-voltage resistant element within the IC. Specifically, an emitter follower circuit is provided in which the emitter of a high-voltage resistant NPN transistor is connected to a low-voltage resistant element, and it base is connected to a Zener diode having the breakdown voltage characteristic of a predetermined voltage (for example, 5 V). In this way, a voltage exceeding the breakdown voltage is prevented from being applied to the low-voltage resistant element.

An overvoltage protection circuit that uses a plurality of discharge circuits and overvoltage detection circuits to protect an internal circuit from ESD and EOS, and a timing controller chip that uses a plurality of ESD protection circuits and operational amplifiers to enhance resistance to EOS are disclosed and proposed (see, for example, patent documents 1 and 2).

Background Art Related to the Second Invention

FIG. 8 is a diagram showing a conventional example of a step-up power supply device. The step-up power supply device of the present conventional example is configured to turn on and off a transistor N1 to generate a step-up voltage AVDD from an input voltage VIN. When its step-up operation is stopped, the step-up power supply device of the present conventional example turns on a transistor N2 to rapidly discharge the step-up voltage AVDD.

As an example of the conventional technology related to what has been described above, patent document 3 can be picked up.

Background Art Related to the Third Invention

Conventionally, as a circuit that performs, for example, power supply to an electronic appliance, various power supply circuits are utilized. While, as one form of such a power supply circuit, a power supply IC that supplies a gate voltage to a gate driver for driving a liquid crystal display panel is being used, its configuration and the like will be described briefly below.

FIG. 17 schematically shows part of the configuration of the power supply IC (conventional example) and the form of connection to its peripheral devices. As shown in the figure, the power supply IC 100 includes external terminals (Ta, Tb and $T_{RD}$). The external terminal Ta is used as an input terminal of a reference gate voltage VGH, the external terminal Tb is connected to a gate driver 200 and the external terminal $T_{RD}$ is used for connection to an external resistor 400 (which is an external component as seen from the power supply IC 100).

The liquid crystal display panel is connected to the external terminal Tb through the gate driver 200, and a constant voltage source 500 (whose voltage value is assumed to be Vc) is connected to the external terminal $T_{RD}$ through the external resistor 400. The gate driver 200 selects, as necessary, a gate line (that is connected to the gate of a TFT (thin film transistor)) of the liquid crystal display panel 300 so as to synchronize with a video signal, and supplies a gate voltage input to the gate line from the power supply IC 100. The individual portions (100 to 500) shown in FIG. 17 form a liquid crystal display device together with the other components.

The power supply IC 100 includes a controller 101 and switch elements (102, 103), and they are connected as shown in FIG. 17. Based on a control signal FLK fed from the preceding stage circuit, the controller 101 controls the switching of the turning on and off of the switch elements (102, 103). More specifically, the control is performed such that a period during which the switch element 102 is on and the switch element 103 is off (on-period) and a period during which the switch element 103 is on and the switch element 102 is off (off-period) are switched according to timing indicated by the control signal FLK.

Thus, the voltage of the external terminal Tb becomes a gate voltage VGHM generated by the modulation of the reference gate voltage VGH, and the gate voltage VGHM is output to the gate driver 200. During the on-period, the continuity between the external terminal Ta and the external terminal Tb is achieved, and the gate voltage VGHM is increased by charging using power input from the external terminal Ta such that the gate voltage VGHM is equivalent to the reference gate voltage VGH. Thus, the gate voltage VGHM is switched to H-level (the state where each TFT is turned on).

On the other hand, during the off-period, the continuity between the external terminal Tb and the external terminal $T_{RD}$ is achieved, and the gate voltage VGHM is decreased by discharge to the outside through the external resistor 400 such that the gate voltage VGHM is equivalent to the voltage Vc. Hence, the gate voltage VGHM is switched to L-level (the state where each TFT is turned off). As described above, the gate voltage VGHM has an approximate pulse waveform where the H level and the L level alternately appear.

Here, the external resistor 400 is a component that realizes a so-called gate shooting function (hereinafter shortly referred to as the "GS function"). The GS function is a function mainly for reducing screen flickering (flicker). In the GS function, the waveform of the gate voltage is inclined, and thus the blurring of the waveform caused by the distance from the gate driver is made uniform, and the displacement of timing at which the TFT is turned on and off is reduced, and thus the screen flickering is reduced.

The external resistor 400 forms a CR circuit together with a panel capacitor included in the liquid crystal display panel 300, and discharge to the outside through the external resistor 400 is performed as CR discharge. In this way, the falling portion of the waveform of the gate voltage VGHM is inclined, and thus the GS function is realized. Not a ground point (GND) but the constant voltage source 500 is connected to the external resistor 400, and thus the gate voltage VGHM is prevented from being dropped excessively (dropped below the voltage Vc).

As an example of the conventional technology related to what has been described above, patent document 4 can be picked up.

RELATED ART DOCUMENT

Patent Document

Patent document 1: JP-A-2010-278419
Patent document 2: JP-A-2007-151065
Patent document 3: JP-A-2010-283950
Patent document 4: JP-A-2008-9364

DISCLOSURE OF THE INVENTION

Problems to be Solved by the Invention

Problem to be Solved by the First Invention

However, in the technology disclosed above, for example, when an anti-ESD element or a high-voltage resistant LDO chip is provided in the outside of the IC, the size and the cost of the entire set are disadvantageously increased. When all the interior of the IC is formed with high-voltage resistant elements, the cost of the IC itself is disadvantageously increased.

When an emitter follower circuit is provided within the IC, since only a voltage which is lower than an input voltage by a voltage between the base and the emitter of an NPN transistor can be supplied to an internal circuit, it may not be operated when the input voltage is reduced. Hence, even when the input voltage is within the operable voltage range of the internal circuit, it is likely that the internal circuit cannot be operated.

In view of the foregoing problem found by the inventor of the present application, an object of the first invention is to provide an overvoltage protection circuit which can prevent, with a simple configuration, an internal circuit including a low-voltage resistant element from being broken by a surge voltage and in which the internal circuit can be operated even when the surge voltage is generated or reduced and a semiconductor device which is formed by integrating such an overvoltage protection circuit.

Problem to be Solved by the Second Invention

As compared with a configuration in which the step-up voltage AVDD is naturally discharged after the stop of the step-up operation, the step-up power supply device of the conventional example shown in FIG. 8 can rapidly discharge the step-up voltage AVDD, and thus it is possible to prevent an unintentional operation of a load.

However, in the step-up power supply device of the conventional example described above, when the step-up voltage AVDD becomes lower than the input voltage VIN by the discharge of the step-up voltage AVDD, a current flows through a path from the application end of the input voltage VIN to a ground end through a coil L, a diode D, a resistor R and the transistor N2, with the result that, disadvantageously, the power consumption (for example, power consumption at the time of standby) is unnecessarily increased.

In view of the foregoing problem found by the inventor of the present application, an object of the second invention is to provide a step-up power supply device that can appropriately discharge a step-up voltage.

Problem to be Solved by the Third Invention

In the power supply IC of the conventional example shown in FIG. 17, it is possible to supply the gate voltage to the gate driver while the GS function is provided. However, in order to achieve the GS function, it is necessary to provide an external resistor for externally connecting the power supply IC. Since this leads to an increase in the number of components necessary for manufacturing a liquid crystal display device, it is not preferable in terms of the manufacturing cost and the like.

When the external resistor is externally connected to the power supply IC, it is necessary to provide an external terminal (PIN) for connecting the external resistor to the power supply IC. Since this leads to an increase in the number of external terminals of the power supply IC, it is not preferable in terms of the manufacturing cost and the like.

In view of the foregoing problem, an object of the third invention is to provide a power supply circuit that can easily reduce the manufacturing cost and the like while it has the GS function and can supply a gate voltage to a gate driver. Another object is to provide a liquid crystal display device including such a power supply circuit.

Means for Solving the Problem

First Invention

According to the first invention of the various inventions disclosed in the present specification, there is provided an overvoltage protection circuit including: a first transistor which is a P-channel field-effect transistor, whose source is connected to an input terminal and whose drain is connected to an internal circuit; a first resistor which is connected between a gate of the first transistor and a ground end; and a short circuit that short-circuits the source and the gate of the first transistor while an application voltage of the input terminal exceeds a predetermined threshold value (configuration of 1-1).

Preferably, in the overvoltage protection circuit of the configuration of 1-1, the short circuit includes: a second transistor which is a P-channel field-effect transistor, whose source is connected to the input terminal and whose drain is connected to the gate of the first transistor; a second resistor which is connected between the a gate of the second transistor and the input terminal; and a first Zener diode which is connected between the gate of the second transistor and the ground end (configuration of 1-2).

Preferably, in the overvoltage protection circuit of the configuration of 1-2, a bypass circuit which supplies a constant voltage from the input terminal to the internal circuit while the voltage of the input terminal exceeds the threshold value (configuration of 1-3).

Preferably, in the overvoltage protection circuit of the configuration of 1-3, the bypass circuit includes: an NPN transistor whose collector is connected to the input terminal and whose emitter is connected to the internal circuit; a second Zener diode which is connected between a base of the NPN transistor and the ground end; and a third resistor which is connected between the base of the NPN transistor and the input terminal (configuration of 1-4).

Preferably, in the overvoltage protection circuit of the configuration of 1-3, each of the first transistor, the second transistor and the NPN transistor is high-voltage resistant as compared with an element of the internal circuit (configuration of 1-5).

A semiconductor device according to the first invention is configured by integrating the overvoltage protection circuit of any one of the configurations of 1-1 to 1-5 (configuration of 1-6).

A power supply device according to the first invention includes the semiconductor device of the configuration 1-6 (configuration of 1-7).

A liquid crystal display device according to the first invention includes the power supply circuit of the configuration 1-7 (configuration of 1-8).

An electronic device according to the first invention includes the liquid crystal display device of the configuration 1-8 (configuration of 1-9).

Preferably, the electronic device of the configuration 1-9 is a tablet PC (configuration of 1-10).

Second Invention

According to the second invention of the various inventions disclosed in the present specification, there is provided a step-up power supply device including: a power supply circuit which generates a step-up voltage from an input voltage; and an output discharge circuit which starts discharge of the step-up voltage when an instruction to stop the generation of the step-up voltage is provided based on a predetermined control signal and which stops the discharge of the step-up voltage when the step-up voltage is dropped below a first threshold voltage (configuration of 2-1).

Preferably, in the step-up power supply device of the configuration of 2-1, the output discharge circuit restarts the discharge of the step-up voltage when, with the instruction to stop the generation of the step-up voltage provided, the step-up voltage exceeds a second threshold voltage higher than the first threshold voltage (configuration of 2-2).

Preferably, in the step-up power supply device of the configuration of 2-2, the first threshold voltage and the second threshold voltage are variable voltages which are varied according to the input voltage (configuration of 2-3).

Preferably, in the step-up power supply device of the configuration of 2-3, the output discharge circuit includes: a comparator which compares the step-up voltage and the first threshold voltage and the second threshold voltage to output a comparison signal; a logical gate which generates a discharge control signal based on the control signal and the comparison signal; and a switch which achieves/interrupts continuity between an application end of the step-up voltage and a ground end according to the discharge control signal (configuration of 2-4).

Preferably, in the step-up power supply device of the configuration of 2-4, the switch is an N-channel field-effect transistor (configuration of 2-5).

Preferably, in the step-up power supply device of the configuration of 4, the switch is a P-channel field-effect transistor (configuration of 6).

Preferably, in the step-up power supply device of any one of the configurations of 2-4 to 2-6, the output discharge circuit further includes a resistor inserted between the application end of the step-up voltage and the switch (configuration of 2-7).

A liquid crystal display device according to the second invention includes the step-up power supply device of the configuration of 2-7 (configuration of 2-8).

A television set according to the second invention includes the liquid crystal display device of the configuration of 2-8 (configuration of 2-9).

Third Invention

According to the third invention of the various inventions disclosed in the present specification, there is provided a power supply circuit that supplies a gate voltage to a gate driver which drives a liquid crystal display panel, where the power supply circuit is formed as an integrated circuit where a connection terminal connected to the gate driver and a gate voltage generation circuit which generates the gate voltage of an approximate pulse waveform to output the gate voltage to the gate driver through the connection terminal are provided, and, within the integrated circuit, an inclination provision portion which provides an inclination to the waveform of the gate voltage is provided (configuration of 3-1).

In the configuration of 3-1, it is possible to supply the gate voltage to the gate driver while achieving the GS function and also easily reduce the manufacturing cost and the like.

Preferably, in the configuration of 3-1, the power supply circuit includes: a voltage input terminal to which a reference gate voltage is input; and a low-voltage portion which is set at a voltage lower than the reference gate voltage, where, in the gate voltage generation circuit, the connection terminal is connected to the voltage input terminal such that the gate voltage is switched to H-level, and the connection terminal is connected to the low-voltage portion such that the gate voltage is switched to L-level (configuration of 3-2).

In the configuration of 3-2, it is possible to generate the gate voltage so as to modulate the reference gate voltage.

Specifically and preferably, in the configuration of 3-2, the inclination provision portion sets the inclination such that the inclination can be varied according to a given instruction (configuration of 3-3).

Specifically and preferably, in the configuration of 3-3, the inclination provision portion is formed with a variable current source circuit which sets a value of a current flowing from the connection terminal to the low-voltage portion according to the instruction (configuration of 3-4).

Specifically and preferably, in the configuration of 3-4, the variable current source circuit includes: a resistor which is provided between the connection terminal and the low-voltage portion; a switch element which is provided between the resistor and the connection terminal; and an operation amplifier which controls the switch element such that a voltage value between the resistor and the switch element is a voltage value corresponding to the instruction (configuration of 3-5).

Specifically and preferably, in the configuration of 3-3, the inclination provision portion is provided between the connection terminal and the low-voltage portion and is formed with a variable resistor which sets a resistance value according to the instruction (configuration of 3-6).

Specifically and preferably, in the configuration of 3-6, the variable resistor forms a CR circuit together with a panel capacitor included in the liquid crystal display panel, and performs, as CR discharge, discharge from the liquid crystal display panel to the low-voltage portion (configuration of 3-7).

Specifically and preferably, in any one of the configurations of 3-1 to 3-7, the power supply circuit further includes a voltage protection circuit which achieves non-continuity between the connection terminal and the low-voltage portion when the gate voltage reaches a predetermined lower limit value (configuration of 3-8).

A liquid crystal display device according to the third invention includes the power supply circuit of any one of the configurations of 3-1 to 3-8 (configuration of 3-9). With the present configuration, it is possible to obtain the advantages of the power supply circuit configured as described above.

A television set according to the third invention includes the liquid crystal display device of the configuration of 3-9 (configuration of 3-10).

Advantages of the Invention

Advantages of the First Invention

In the first invention, it is possible to provide an overvoltage protection circuit which can prevent, with a simple configuration, an internal circuit including a low-voltage resistant element from being broken by a surge voltage and in which the internal circuit can be operated even when the surge voltage is generated or reduced and a semiconductor device which is formed by integrating such an overvoltage protection circuit.

Advantages of the Second Invention

In the second invention, it is possible to provide a step-up power supply device that can appropriately discharge a step-up voltage.

Advantages of the Third Invention

In the power supply circuit of the third invention, it is possible to easily reduce the manufacturing cost and the like while the GS function is provided and it is possible to supply a gate voltage to a gate driver. With the liquid crystal display device of the third invention, it is possible to obtain the advantages of the power supply circuit according to the third invention.

BRIEF DESCRIPTION OF DRAWINGS

FIG. 12 A graph of the waveforms of a gate voltage and the like;

DESCRIPTION OF EMBODIMENTS

<Liquid Crystal Display Device>

Figure 1:
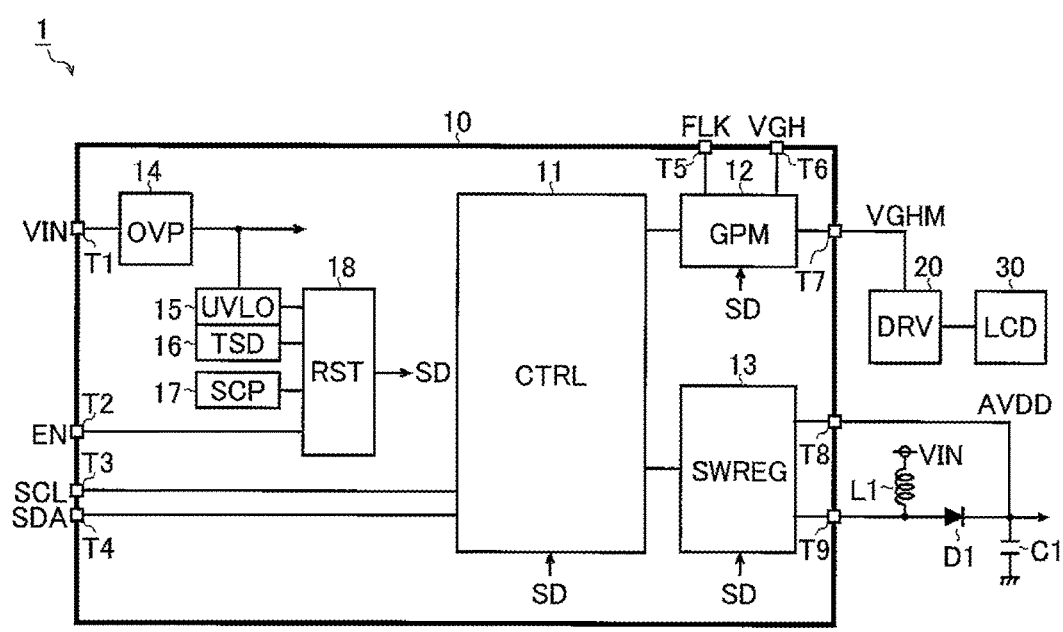
FIG. 1 A block diagram showing an example of the configuration of a liquid crystal display device.

FIG. 1 is a block diagram showing an example of the configuration of a liquid crystal display device. The liquid crystal display device 1 of the present configuration example includes a power supply IC 10, a gate driver 20 and a liquid crystal display panel 30, and also includes, as discrete elements externally connected to the power supply IC 10, a coil L1, a diode D1 and a capacitor C1. The liquid crystal display device 1 also includes, in addition to the components described above, a circuit that receives a video signal (for example, a television broadcast signal) and the like; this video signal is used, and thus video is displayed on the liquid crystal display panel 30.

The power supply IC 10 receives an input voltage VIN (for example, 5 V) to supply power (such as AVDD or VGHM) to the gate driver 20 and the like.

The gate driver 20 receives the supply of the gate voltage VGHM from the power supply IC 10, and uses it to output a gate signal (vertical scanning signal) to each of the gate lines of the liquid crystal display panel 30. Specifically, the gate driver 20 sequentially selects the gate lines of the liquid crystal display panel 30 so as to synchronize with the video signal, and connects them to the side of the power supply IC 10. Thus, the gate voltage VGHM is input as the voltage of the gate signal to the gate lines connected to the side of the power supply IC 10.

In the liquid crystal display device 1, a source driver (not shown) that outputs a source signal to the liquid crystal display panel 30 is also provided. The source driver and the gate driver 20 may be formed integrally as, for example, a liquid crystal drive IC.

The liquid crystal display panel 30 includes a plurality of pixel electrodes arranged in a matrix, TFTs (thin film transistors) individually provided for the pixel electrodes, the gate lines (scan lines) connected to the gates of the TFTs in individual rows and source lines (data lines) connected to the sources of the TFTs in the individual rows; the liquid crystal display panel 30 displays an arbitrary character or image according to the gate signal or the source signal supplied. In other words, the liquid crystal display panel 30 is operated so as to adjust, for each pixel, the degree of transmission of backlight according to the gate signal and the source signal, and consequently realizes the display described above.

<Power Supply IC>

The power supply IC 10 (semiconductor device) is a monolithic semiconductor integrated circuit device obtained by integrating a control portion 11, a gate pulse modulation portion 12, a switching regulator portion 13, an overvoltage protection portion 14 (overvoltage protection circuit), a voltage reduction protection portion 15, a temperature protection portion 16, a short protection portion 17 and a reset portion 18.

The power supply IC 10 also includes external terminals T1 to T9 as means for achieving electrical connection to the outside. The external terminal T1 (input terminal) is an input terminal of the input voltage VIN. The external terminal T2 is an input terminal of an enable signal EN. The external terminal T3 is an input terminal of a serial clock signal SCLK. The external terminal T4 is an input/output terminal of a serial data signal SDA. The external terminal T5 is an input terminal of a modulation control signal FLK (pulse signal). The external terminal T6 is an input terminal of predetermined power (a constant reference gate voltage VGH). The external terminal T7 is an output terminal of the gate voltage VGHM, and the gate driver 20 is connected thereto. The external terminal T8 is a feedback terminal of the step-up voltage AVDD. The external terminal T9 is a switching terminal.

The control portion 11 comprehensively controls the operations of the individual portions of the power supply IC 10. For example, a protection current value Sv and a discharge current value Si on the operation of the gate pulse modulation portion 12 and a target voltage value of the switching regulator portion 13 each are set by the control portion 11 such that they can be varies. The control portion 11 has the function of performing, through the external terminals T3 and T4, two-line serial two-way communication with the outside of the power supply IC 10, and each of the various setting values described above can be arbitrarily varied from the outside.

The protection voltage value Sv is a value that is set lower than the reference gate voltage VGH. Information (digital information) on the protection voltage value Sv and the discharge control value Si that has been set is fed out from the control portion 11 to the gate pulse modulation portion 12, and thus the information is reflected on the operation of the gate pulse modulation portion 12.

The gate pulse modulation portion 12 performs, according to the modulation control signal FLK, predetermined modulation processing on the reference gate voltage VGH (for example, 20 to 30 V) to generate the gate voltage VGHM, and outputs it to the external terminal T7. The configuration and the operation of the gate pulse modulation portion 12 will be described in detail later.

The switching regulator portion 13 forms a step-up switching regulator together with the coil L1, the diode D1 and the capacitor C1 externally attached to the power supply IC 10. In the outside of the power supply IC 10, the first end of the coil L1 is connected to the application end of the input voltage VIN. The second end of the coil L1 and the anode of the diode D1 each are connected to the external terminal T9. The cathode of the diode D1 is connected to the output end of the step-up voltage AVDD and is also connected to the external terminal T8. The capacitor C1 is connected between the output end of the step-up voltage AVDD and the ground end.

The overvoltage protection portion 14 monitors whether or not the input voltage VIN is in an overvoltage state, and achieves/interrupts, based on the result of the monitoring, the continuity of a power supply path to the internal circuit (such as the control portion 11).

The voltage reduction protection portion 15 monitors whether or not the input voltage VIN input through the overvoltage protection portion 14 is in a voltage reduction state, and transmits the result of the monitoring to the reset portion 18.

The temperature protection portion 16 monitors whether or not the junction temperature Tj of the power supply IC 10 exceeds a predetermined upper limit value (for example, 175° C.), and transmits the result of the monitoring to the reset portion 18.

The short protection portion 17 monitors whether or not grounding (short circuit to the ground end or a low-voltage end equivalent thereto) occurs in the step-up voltage AVDD, and transmits the result of the monitoring to the reset portion 18.

The reset portion 18 generates a shutdown signal SD based on a voltage reduction protection signal input from the voltage reduction protection portion 15, a temperature protection signal input from the temperature protection portion 16, a short protection signal input from the short protection portion 17 and the enable signal EN input from the external terminal T2, and outputs it to the individual portions (such as the control portion 11, the gate pulse modulation portion 12 and the switching regulator portion 13) of the power supply IC 10.

<Overvoltage Protection Portion>

Figure 2:
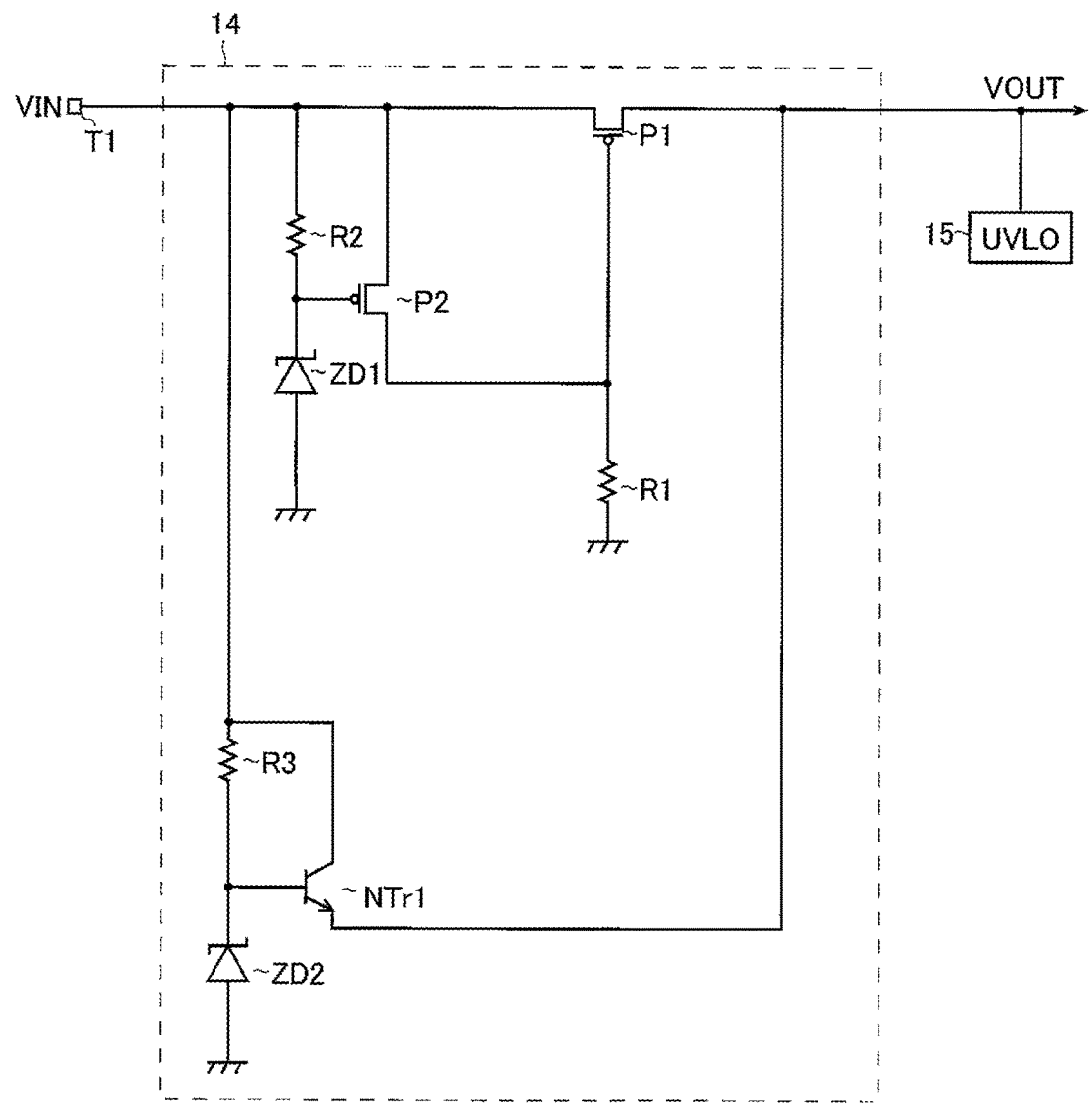
FIG. 2 A circuit diagram showing an example of the configuration of an overvoltage protection circuit.

FIG. 2 is a circuit diagram showing an example of the configuration of the overvoltage protection portion 14. The overvoltage protection portion 14 of the present configuration example includes: a P-channel MOS (metal oxide semiconductor) filed-effect transistor P1 (first transistor); a resistor R1 (first resistor); a P-channel MOS filed-effect transistor P2 (second transistor); a resistor R2 (second resistor); a Zener diode ZD1 (first Zener diode); an NPN bipolar transistor NTr1 (NPN transistor); a resistor R3 (third resistor); and a Zener diode ZD2 (second Zener diode). The input voltage VIN is input to the overvoltage protection portion 14 through the external terminal T1. When the input voltage VIN is not in the overvoltage state, the overvoltage protection portion 14 outputs the input voltage VIN, without being little lowered, as the output voltage Vout to the internal circuit (which is the control portion 11, the voltage reduction protection portion 15 and the like and which is not shown in FIG. 2) formed with low-voltage resistant elements whereas, when the input voltage VIN is in the overvoltage state, the overvoltage protection portion 14 clamps the input voltage VIN to a predetermined upper limit value and then outputs it as the output voltage Vout to the internal circuit. This overvoltage protection operation will be described in detail later.

The source of the P-channel MOS filed-effect transistor P1 (hereinafter referred to as a "transistor P1") is connected to the external terminal T1. The drain of the transistor P1 is connected to the internal circuit.

The first end of the resistor R1 is connected to the ground end. The second end of the resistor R1 is connected to the gate of the transistor P1 and the drain of the P-channel MOS filed-effect transistor P2 (hereinafter referred to as a "transistor P2").

The source of the transistor P2 is connected to the connection node between the external terminal T1 and the source of the transistor P1. The drain of the transistor P2 is connected to the connection node between the gate of the transistor P1 and the resistor R1. The gate of the transistor P2 is connected to the connection node between the resistor R2 and the cathode of the Zener diode ZD1.

The first end of the resistor R2 is connected to the connection node between the external terminal T1 and the source of the transistor P1. The second end of the resistor R2 is connected through the Zener diode ZD1 to the ground end.

The cathode of the Zener diode ZD1 is connected to the second end of the resistor R2. The anode of the Zener diode ZD1 is connected to the ground end.

The emitter of the NPN bipolar transistor NTr1 (hereinafter referred to as a "transistor NTr1") is connected to the connection node between the drain of the transistor P1 and the internal circuit. The base of the transistor NTr1 is connected to the connection node between the resistor R3 and the cathode of the Zener diode ZD2. The collector of the transistor NTr1 is connected to the connection node between the external terminal T1 and the resistor R3.

The first end of the resistor R3 is connected to the connection node between the external terminal T1 and the source of the transistor P1. The second end of the resistor R3 is connected through the Zener diode ZD2 to the ground end.

The cathode of the Zener diode ZD2 is connected to the second end of the resistor R3. The anode of the Zener diode ZD2 is connected to the ground end.

As the transistor P1, the transistor P2 and the transistor NTr1 described above, transistors having the property of higher-voltage resistance than the elements of the internal circuit are used. More specifically, when the elements of the internal circuit are only resistant to up to 7 V, and a surge voltage of 20 to 30 V is assumed, transistors that can be resistant to about 30 V are used.

Figure 3:
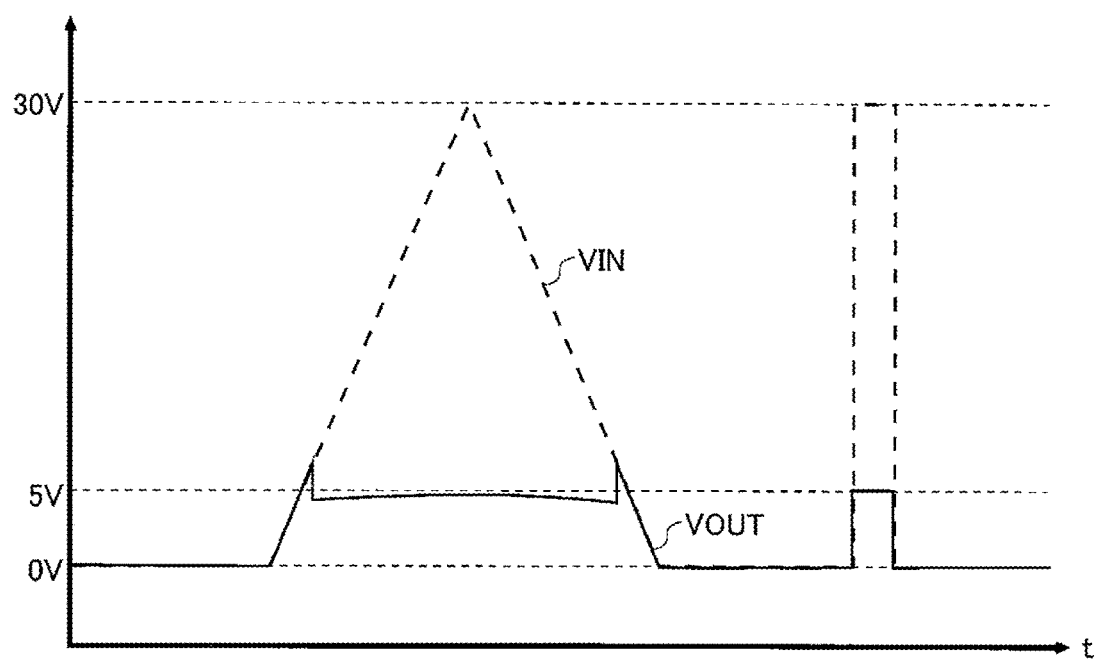
FIG. 3 An input/output characteristic diagram of an overvoltage protection portion 14.

The operation of the overvoltage protection portion 14 will now be described with reference to FIG. 3, as necessary. FIG. 3 is an input/output characteristic diagram of the overvoltage protection portion 14. The horizontal axis of FIG. 3 represents the passage of time and its vertical axis represents the magnitude of the voltage. The broken lines in FIG. 3 represent the behavior of the input voltage VIN and the sold lines represent the behavior of the output voltage Vout. In FIG. 3, for two cases, that is, a case where the input voltage VIN is gently brought into the overvoltage state (the left side) and a case where the input voltage VIN is rapidly brought into the overvoltage state (the right side), the input/output characteristic of the overvoltage protection portion 14 is illustrated.

In the present embodiment, when the input voltage VIN (for example, normally 5 V) exceeds a predetermined threshold value, that is, when the input voltage VIN is brought into the overvoltage stage, the transistor P2, the resistor R2 and the Zener diode ZD1 are operated as a short circuit that short-circuits the portion between the source and the gate of the transistor P1. When the input voltage VIN is brought into the overvoltage state, the transistor NTr1, the resistor R3 and the Zener diode ZD2 are operated as a bypass circuit that clamps the input voltage VIN input from the external terminal T1 to a predetermined upper limit and that then outputs it as the output voltage Vout to the internal circuit.

The threshold value described above is assumed to be previously determined based on the voltage resistant performance of the internal circuit. For example, when the internal circuit is resistant to up to an application voltage of 7 V, a voltage slightly lower than this voltage is determined as the threshold value.

For example, if it is assumed that the breakdown voltage of the Zener diode ZD1 is 5 V and that an on-threshold voltage of the transistor P2 is 0.7 V, when the input voltage VIN exceeds 5.7 V, the transistor P2 is turned on, and a short circuit occurs between the gate and the source of the transistor P1. In other words, the Zener diode ZD1 having a breakdown voltage of 5 V is used, and thus the threshold value described above is set at 5.7 V.

An operation when the input voltage VIN does not exceed the predetermined threshold value, that is, when the input voltage VIN is not in the overvoltage state, will first be described.

When the input voltage VIN is not in the overvoltage state, between the source and the gate of the transistor P2, a potential difference that exceeds the on-threshold voltage of the transistor P2 is not produced. Hence, the transistor P2 is turned off, and thus a short circuit is prevented from occurring between the source and the gate of the transistor P1.

In the above state, the input voltage VIN is input to the source of the transistor P1. The gate of the transistor P1 is made to have a reference potential by the ground end connected through the resistor R1. Consequently, between the source and the gate of the transistor P1, a potential difference exceeding the on-threshold voltage of the transistor P1 is produced.

Hence, the transistor P1 is turned on, and the input voltage VIN input from the external terminal T1 is supplied to the internal circuit as the output voltage Vout without being little lowered.

When the input voltage VIN is not in the overvoltage state, since the transistor P1 is on, approximately the input voltage VIN (normally, 5 V) is applied to the emitter of the transistor NTr1. Here, when the breakdown voltage of the Zener diode ZD2 is assumed to be 5 V, between the base and the emitter of the transistor NTr1, a potential difference exceeding the on-threshold voltage of the transistor NTr1 is not produced. Hence, the transistor NTr1 is turned off, and the operation of the bypass circuit is stopped.

An operation when the input voltage VIN is in the overvoltage state will now be described.

When the input voltage VIN is in the overvoltage state, though the gate of the transistor P2 is maintained at a constant voltage (for example, 5 V) by the Zener diode ZD1, the input voltage VIN exceeding this constant voltage is applied to the source of the transistor P2. Hence, between the source and the gate of the transistor P2, a potential difference exceeding the on-threshold voltage of the transistor P2 is produced. Thus, the transistor P2 is turned on, and the source and the gate of the transistor P1 are short-circuited.

In this way, the potential difference between the gate and the source of the transistor P1 disappears, the transistor P1 is turned off and the input voltage VIN in the overvoltage state, that is, the surge voltage, is prevented from being applied from the external terminal T1 to the internal circuit.

When the input voltage VIN is in the overvoltage state, since the transistor P1 is off, the power supply path to the internal circuit through the transistor P1 is interrupted. However, from the emitter of the transistor NTr1, a constant voltage (for example, 4.3 V) obtained by subtracting a drop voltage (for example, 0.7 V) between the base and the emitter of the transistor NTr1 from the breakdown voltage (for example, 5 V) of the Zener diode ZD2 is applied as the output voltage Vout to the internal circuit. Consequently, in the overvoltage state, the operation of the internal circuit is prevented from being stopped.

In the present embodiment described above, when the input voltage VIN is not in the overvoltage state, in the path from the external terminal T1 to the internal circuit through the transistor P1, the input voltage VIN is supplied as the output voltage Vout to the internal circuit without being little lowered, and the operation of the bypass circuit is stopped. When the input voltage VIN is in the overvoltage state, the surge voltage from the external terminal T1 to the internal circuit is interrupted, and the output voltage Vout with the upper limit value clamped by the bypass circuit is supplied to the internal circuit.

In this way, it is possible to prevent, with a simple configuration, the internal circuit including low-voltage resistant elements from being broken by the surge voltage. Since voltage can be supplied to the internal circuit by the bypass circuit even when the surge voltage is produced, it is possible to prevent the stop of the operation of the internal circuit and the occurrence of the resetting.

A description will be further given of the situation at the time of the voltage reduction. If as in the conventional technology, a high-voltage resistant emitter follower circuit is provided between the application end of the input voltage VIN and the internal circuit, and only the emitter follower circuit is used to supply the constant voltage to the internal circuit, a loss corresponding to a voltage between the base and the emitter of the NPN transistor of the emitter follower circuit is constantly produced. Hence, even when the input voltage VIN exceeds the operation limit voltage (for example, 3.3 V) of the internal circuit, if the voltage (VIN −0.7 V) supplied to the internal circuit through the emitter follower circuit is dropped below the operation limit voltage described above, it is likely that the internal circuit cannot be operated. In the present embodiment, in order to overcome this problem, it is possible to supply, at the time of the normal operation, the input voltage VIN through the transistor P1 to the internal circuit without the input voltage VIN being little lowered. Thus, even when the input voltage VIN is lowered to around the operation limit voltage (for example, 3.3 V) of the internal circuit, the internal circuit can be operated.

<Application to a Tablet PC>

Figure 4:
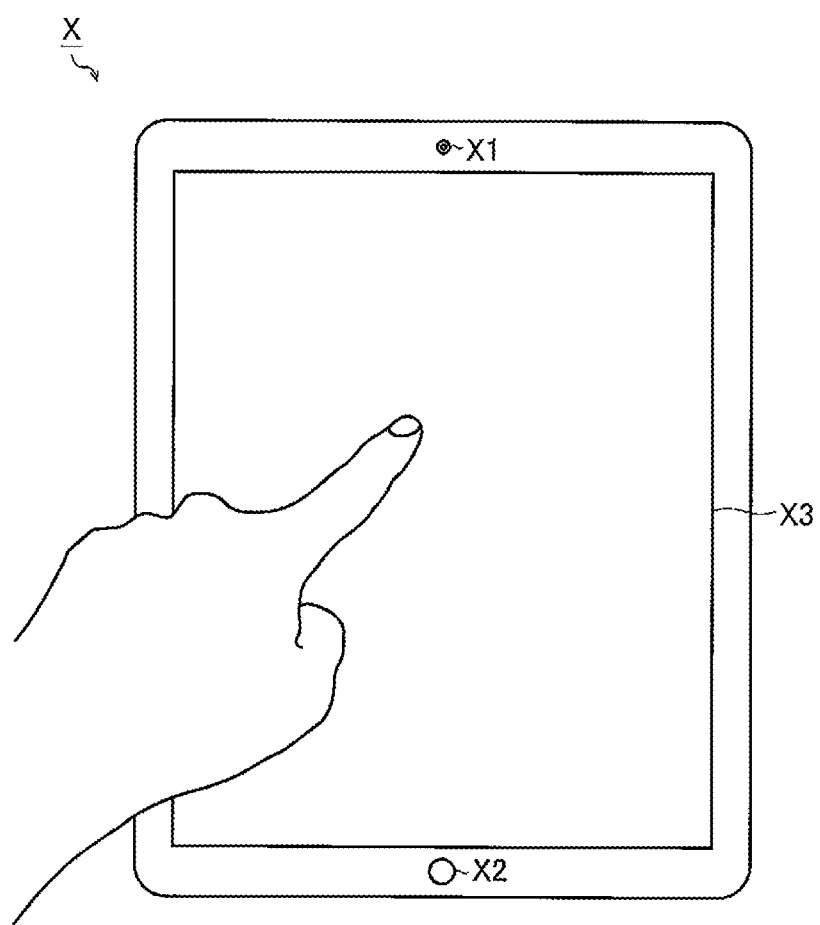
FIG. 4 An external view of an electronic device (tablet PC) incorporating the liquid crystal display device 1.

FIG. 4 is an external view of an electronic device (tablet PC) incorporating the liquid crystal display device 1. The electronic device A of the present configuration example includes: an image sensing portion A1 that is incorporated in the front surface or the back surface of the main body; an operation portion A2 (such as various buttons) that receives a user operation; and a display portion A3 that displays characters and video (including a shot image). The display portion A3 has a touch panel function for receiving a touch operation by the user. In the liquid crystal display device 1 described above, as the display portion A3, the electronic device A can be incorporated.

<Switching Regulator Portion>

Figure 5:
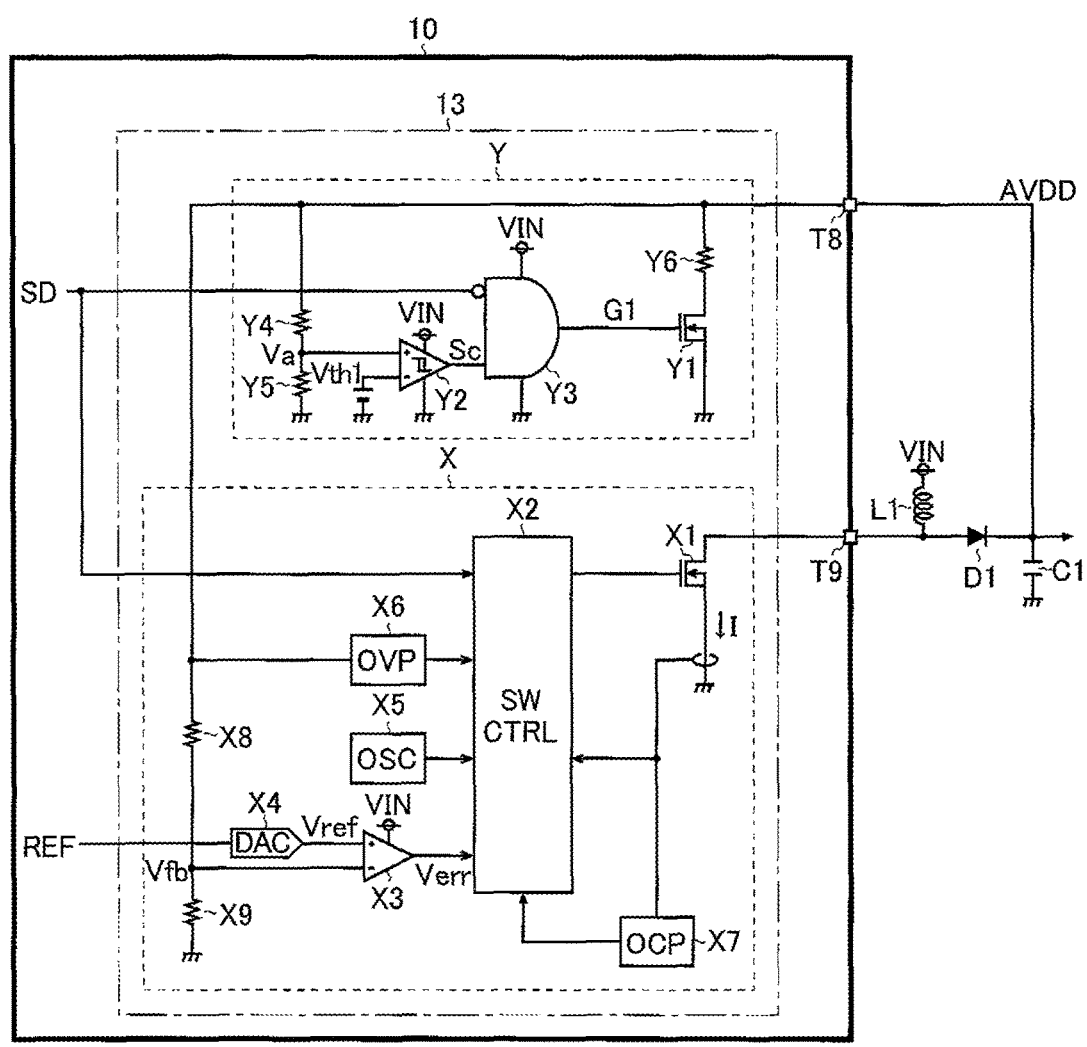
FIG. 5 A diagram showing a first configuration example of a switching regulator portion 13.

FIG. 5 is a diagram showing a first configuration example of the switching regulator portion 13. The switching regulator portion 13 of the first configuration example includes a power supply circuit X and an output discharge circuit Y.

The power supply circuit X is a circuit block for generating the step-up voltage AVDD from the input voltage VIN, and includes an N-channel MOS (metal oxide semiconductor) filed-effect transistor (output transistor) X1, a switching control portion X2, an air amplifier X3, a digital/analogue converter X4, an oscillator X5, an overvoltage protection portion X6, an overcurrent protection portion X7 and resistors X8 and X9.

The drain of the transistor X1 is connected to the external terminal T9. The source and the back gate of the transistor X1 each are connected to the ground end. The gate of the transistor X1 is connected to the switching control portion X2.

The switching control portion X2 performs on/off control (voltage feedback control) on the transistor X1 such that an error voltage Verr input from the air amplifier X3 is decreased. At the same time when the voltage feedback control described above is performed, the switching control portion X2 performs on/off control (current feedback control) on the transistor X1 such that a switch current I flowing through the transistor X1 is equal to a predetermined target value. The switching control portion X2 also has the function of stopping an operation of generating the step-up voltage AVDD based on the shutdown signal SD input from the reset portion 18. More specifically, when the shutdown signal SD is switched to low-level (logical level at the time of shutting down), the switching control portion X2 turns off the transistor X1 to stop the operation of generating the step-up voltage AVDD. The switching control portion X2 also has the function of stopping the operation of generating the step-up voltage AVDD based on the protection signal input from an overvoltage detection portion X6 or an overcurrent detection portion X7.

The air amplifier X3 amplifies a difference between a feedback voltage Vfb (a division voltage of the step-up voltage AVDD) input from the connection node between the resistors X8 and X9 to an inverting input end (−) and a reference voltage Vref input from the digital/analogue converter X4 to a non-inverting input end (+), thereby generates the error voltage Verr and feeds the error voltage Verr out to the switching control portion X2. The air amplifier X3 is operated by receiving the supply of the input voltage VIN.

The digital/analogue converter X4 convers a digital signal REF (for example, a 6-bit signal) input from the control portion 11 into an analog form to generate the reference voltage Vref.

The oscillator X5 generates a clock signal for determining the switching frequency of the transistor X1, and feeds it to the switching control portion X2.

The overvoltage protection portion X6 monitors the step-up voltage AVDD to generate an overvoltage protection signal, and feeds it out to the switching control portion X2.

The overcurrent protection portion X7 monitors the switch current I flowing through the transistor X1 to generate an overcurrent protection signal, and feeds it out to the switching control portion X2.

The resistors X8 and X9 are connected in series between the external terminal T8 and the ground end, and functions as a resistor division circuit that outputs the feedback voltage Vfb (the division voltage of the step-up voltage AVDD) from the connection node thereof.

The basic operation (direct current/direct current conversion operation) of the power supply circuit X configured as discussed above will be described.

When the transistor X1 is turned on, the switch current I flows through the coil L1 from the application end of the input voltage VIN via the transistor X1 to the ground end, and its electrical energy is stored. When charge has already been accumulated in the capacitor C1 during the on-period of the transistor X1, an output current flows through a load (not shown in FIG. 5) from the capacitor C1. Here, since the potential of the external terminal T9 is lowered to about a ground potential through the transistor X1, the diode D1 is brought into a reverse biased state, and a current does not flow from the capacitor C1 toward the transistor X1. On the other hand, when the transistor X1 is turned off, the electrical energy accumulated therein is discharged by a back electromotive force produced in the coil L1. Here, since the diode D1 is brought into a forward biased state, a current flowing through the diode D1 is passed as an output current into the load, and is also passed into the ground end through the capacitor C1, with the result that the capacitor C1 is charged. The operation described above is repeated, and thus the step-up voltage AVDD higher than the input voltage VIN is supplied.

As described above, the power supply circuit X functions as a constituent element of a step-up power supply device (step-up DC/DC converter) that generates the step-up voltage AVDD from the input voltage VIN by driving the coil L1 serving as an energy storage element through on/off control on the transistor X1.

The output discharge circuit Y is a circuit block that discharges the step-up voltage AVDD based on the shutdown signal SD, and includes an N-channel MOS field-effect transistor (output discharge transistor) Y1, a comparator Y2, an AND gate Y3 and resistors Y4 to Y6.

The drain of the transistor Y1 is connected through the resistor Y6 to the external terminal T8. The source and the back gate of the transistor Y1 each are connected to the ground end. The gate of the transistor Y1 is connected to the output end (the application end of the gate signal G1) of the AND gate Y3. In other words, the transistor Y1 functions as a switch that achieves/interrupts the continuity between the application end of the step-up voltage AVDD and the ground end according to the gate signal (discharge control signal) G1.

The comparator Y2 compares a monitor voltage Va(=AVDD×α (where 0<α≤1)) input from the connection node between the resistors Y4 and Y5 to the non-inverting input end (+) and reference voltages Vth1 and Vth2 input to the inverting input end (−), and thereby generates a comparison signal Sc. Each of the reference voltages Vth1 and Vth2 is a variable voltage (for example, Vth1=VIN×1.1×α, Vth2=VIN×1.2×α) that is varied according to the input voltage VIN.

When the comparison signal Sc is high-level (=VIN), the monitor voltage Va is compared with the reference voltage Vth1. Then, when the monitor voltage Va is dropped below the reference voltage Vth1, the comparison signal Sc is dropped from high-level to low-level (=0 V). When the comparison signal Sc is low-level, the monitor voltage Va is compared with the reference voltage Vth2. Then, when the monitor voltage Va exceeds the reference voltage Vth2, the comparison signal Sc is raised from low-level to high-level. As described above, a hysteresis characteristic is provided with the comparator Y2, and thus it is possible to prevent the unintentional on/off oscillation of the output discharge operation.

The AND gate Y3 performs a logical AND operation on the shutdown signal SD input to the first input end (inverting input polarity) and the comparison signal Sc input to the second input end (non-inverting input polarity) to generate the gate signal G1, and feeds it out to the gate of the transistor Y1. Hence, only when the shutdown signal SD is low-level (logical level at the time of shutting down), and the comparison signal Sc is high-level (logical level at the time of reduction of AVDD), the gate signal G1 is switched to high-level (=VIN); in the other cases, the gate signal G1 is switched to low-level (=0 V).

The resistors Y4 and Y5 are connected in series between the external terminal T8 and the ground end, and functions as a resistor division circuit that outputs the monitor voltage Va (the division voltage of the step-up voltage AVDD) from the connection node thereof.

The resistor Y6 is inserted between the external terminal T8 and the drain of the transistor Y1. In this configuration, in the output discharge circuit Y, the step-up voltage AVDD is discharged based on a time constant corresponding to the capacitance value of the capacitor C1 and the resistance value of the resistor Y6.

In the output discharge circuit Y configured as described above, when based on the shutdown signal SD, an instruction is provided to stop the generation of the step-up voltage AVDD, the discharge of the step-up voltage AVDD is started. Then, after the start of the discharge of the step-up voltage AVDD, the output discharge circuit Y stops the discharge of the step-up voltage AVDD when the monitor voltage Va (corresponding to the step-up voltage AVDD) is dropped below the threshold voltage Vth1. Furthermore, after the stop of the discharge of the step-up voltage AVDD, the output discharge circuit Y restarts the discharge of the step-up voltage AVDD when the monitor voltage Va exceeds the threshold voltage Vth2 higher than the threshold voltage Vth1 (for example, when the threshold voltage Vth2 corresponding to the input voltage VIN is dropped below the monitor voltage Va by a voltage reduction failure in the input voltage VIN). The output discharge operation discussed above will be described using a specific example.

Figure 6:
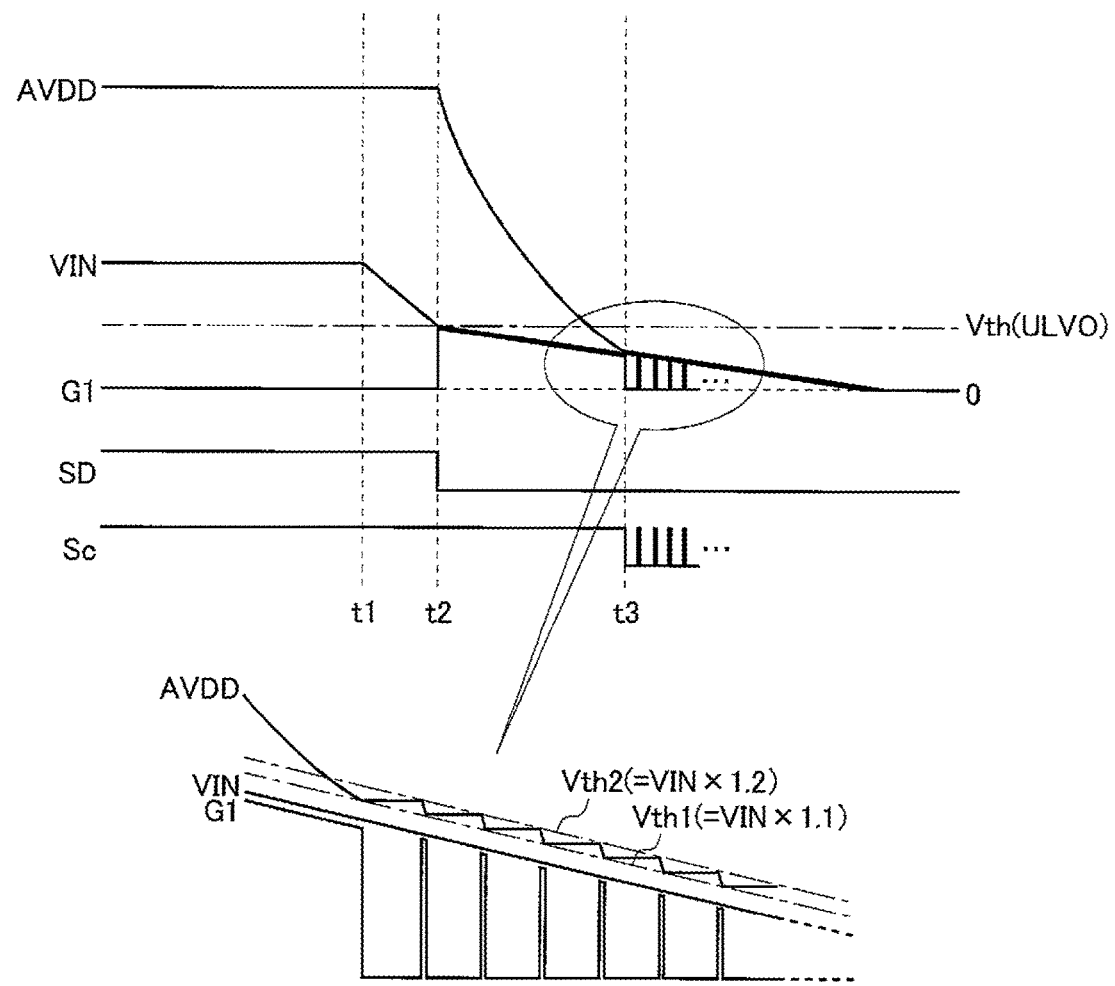
FIG. 6 A time chart showing an example of an output discharge operation.

FIG. 6 is a time chart showing an example of the output discharge operation (how the shutting down is performed by the occurrence of the voltage reduction failure in the input voltage VIN), and show, from above, the step-up voltage AVDD, the input voltage VIN, the gate signal G1, the shutdown signal SD and the comparison signal Sc. Here, for ease of description, it is assumed that the comparator Y2 directly compares the step-up voltage AVDD and the threshold voltages Vth1 and Vth2.

At time t1, the lowering of the input voltage VIN by the voltage reduction failure is started; when at time t2, the input voltage VIN is dropped below the threshold voltage Vth (UVLO), the shutdown signal SD is dropped from high-level to low-level. Here, since the step-up voltage AVDD is higher than the threshold voltage Vth1 (=VIN×1.1), the comparison signal Sc is high-level. Hence, since the gate signal G1 is switched to high-level, the transistor Y1 is turned on, and the continuity between the external terminal T8 and the ground end is achieved. Consequently, since the step-up voltage AVDD is rapidly discharged, it is possible to prevent an unintentional operation of a load.

Thereafter, when at time t3, the step-up voltage AVDD is dropped below the threshold voltage Vth1, the comparison signal Sc is dropped from high-level to low-level. Hence, since the gate signal G1 is switched to low-level, the transistor Y1 is turned off, and the continuity between the external terminal T8 and the ground end is interrupted. Consequently, since the discharge of the step-up voltage AVDD is stopped, it is possible to prevent the step-up voltage AVDD from being dropped below the input voltage VIN, and thus it is possible to prevent an unnecessary current from being drawn in the path from the application end of the input voltage VIN to the ground end through the coil L1, the diode D1, the resistor Y6 and the transistor Y1.

When after time t3, the input voltage VIN is continuously lowered due to the voltage reduction failure, as the input voltage VIN is lowered, the threshold voltages Vth1 and Vth2 are likewise lowered gradually. Then, when the step-up voltage AVDD exceeds the threshold voltage Vth2 (in other words, when the threshold voltage Vth2 is dropped below the step-up voltage AVDD), the comparison signal Sc is raised from low-level to high-level. Hence, since the gate signal G1 is switched to high-level, the transistor Y1 is turned on, and the continuity between the external terminal T8 and the ground end is achieved. Consequently, the discharge operation of the step-up voltage AVDD is restarted.

Thereafter, as long as the input voltage VIN is continuously lowered, the turning on and off of the transistor Y1 is repeated, and the discharge operation of the step-up voltage AVDD is continuously performed. Since the AND gate Y3 for generating the gate signal G1 of the transistor Y1 is operated by receiving the supply of the input voltage VIN, when the input voltage VIN is dropped below the on-threshold voltage Vth of the transistor Y1, it is impossible to turn on the transistor Y1, with the result that the output discharge operation is completed.

Although in FIG. 6, the description has been given using the example where the shutting down is performed by the voltage reduction protection, the same output discharge operation as described above is basically performed at any of the time when the shutting down is performed by temperature protection, the time when the shutting down is performed by short-circuit protection and the time when the shutting down is performed by the enable signal EN. However, when the input voltage VIN is not lowered, since the output discharge operation is prevented from being restarted after the output discharge operation is stopped as a result of the step-up voltage AVDD being lowered below the threshold voltage Vth1, the step-up voltage AVDD is lowered from the threshold voltage Vth1 to the input voltage VIN by natural discharge.

Figure 7:
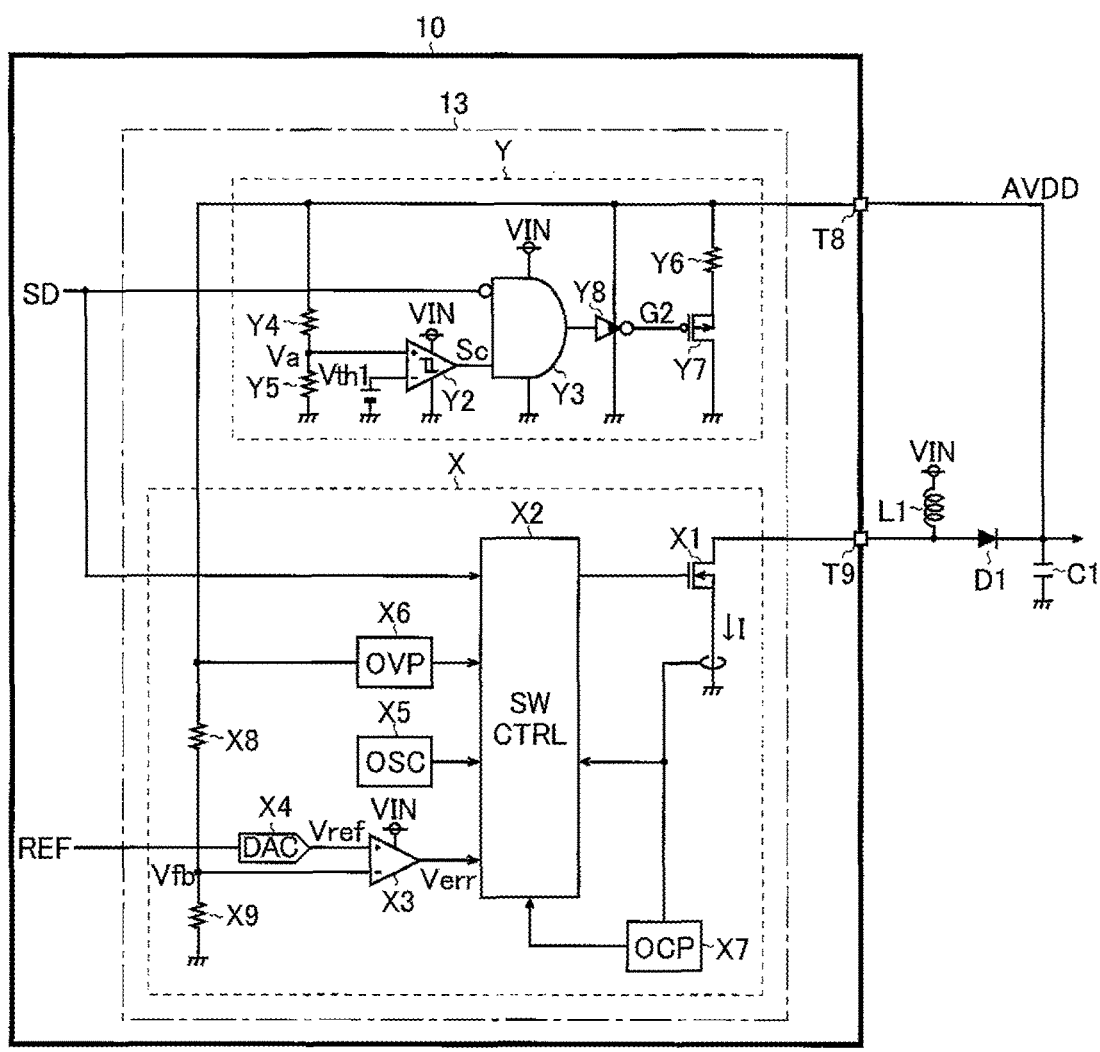
FIG. 7 A diagram showing a second configuration example of the switching regulator portion 13.
Figure 8:
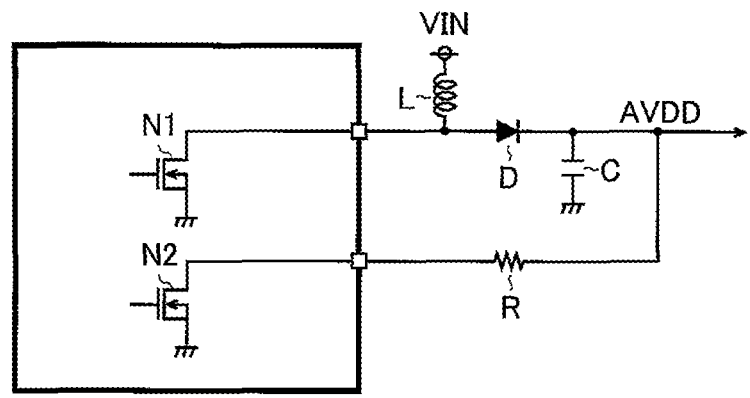
FIG. 8 A diagram showing a conventional example of a step-up power supply device.

FIG. 7 is a diagram showing a second configuration example of the switching regulator portion 13. The switching regulator portion 13 of the second configuration example has substantially the same configuration as in the first configuration example, and is characterized in that a P-channel MOS filed-effect transistor Y7 is used as the output discharge transistor, and that a level shifter Y8 for driving the transistor Y7 is added. Hence, the elements having the same configuration as in the first configuration are identified with the same symbols as in FIG. 5, and their description will not be repeated; the following description will focus on the characteristic portions of the second configuration example.

The source and the back gate of the transistor Y7 each are connected through the resistor Y6 to the external terminal T8. The drain of the transistor Y7 is connected to the ground end. The gate of the transistor Y7 is connected to the output end (the application end of a gate signal G2) of the level shifter Y8.

The level shifter Y8 receives the supply of the step-up voltage AVDD, performs logical inversion and level shift on the output signal of the AND gate Y3 to generate the gate signal G2 and feeds it out to the gate of the transistor Y7. Specifically, when the output signal of the AND gate Y3 is high-level (=VIN), the low-level (=0 V) gate signal G2 is generated whereas when the output signal of the AND gate Y3 is low-level (=0 V), the high-level (=AVDD) gate signal G2 is generated.

In this configuration, the switching regulator portion 13 of the second configuration example can appropriately discharge the step-up voltage AVDD as in the first configuration example described above. In the configuration where the P-channel MOS filed-effect transistor Y7 is used as the output discharge transistor, unlike the configuration where the N-channel MOS filed-effect transistor Y1 is used, even when the input voltage VIN is lowered to 0 V, the transistor Y7 is turned on, and thus it is possible to discharge the step-up voltage AVDD.

Although the above description has been given using the example where the step-up power supply device is incorporated in the liquid crystal display device, wide application to step-up power supply devices as a whole used in other applications can be performed.

Gate Pulse Modulation Portion

First Configuration Example

Figure 11:
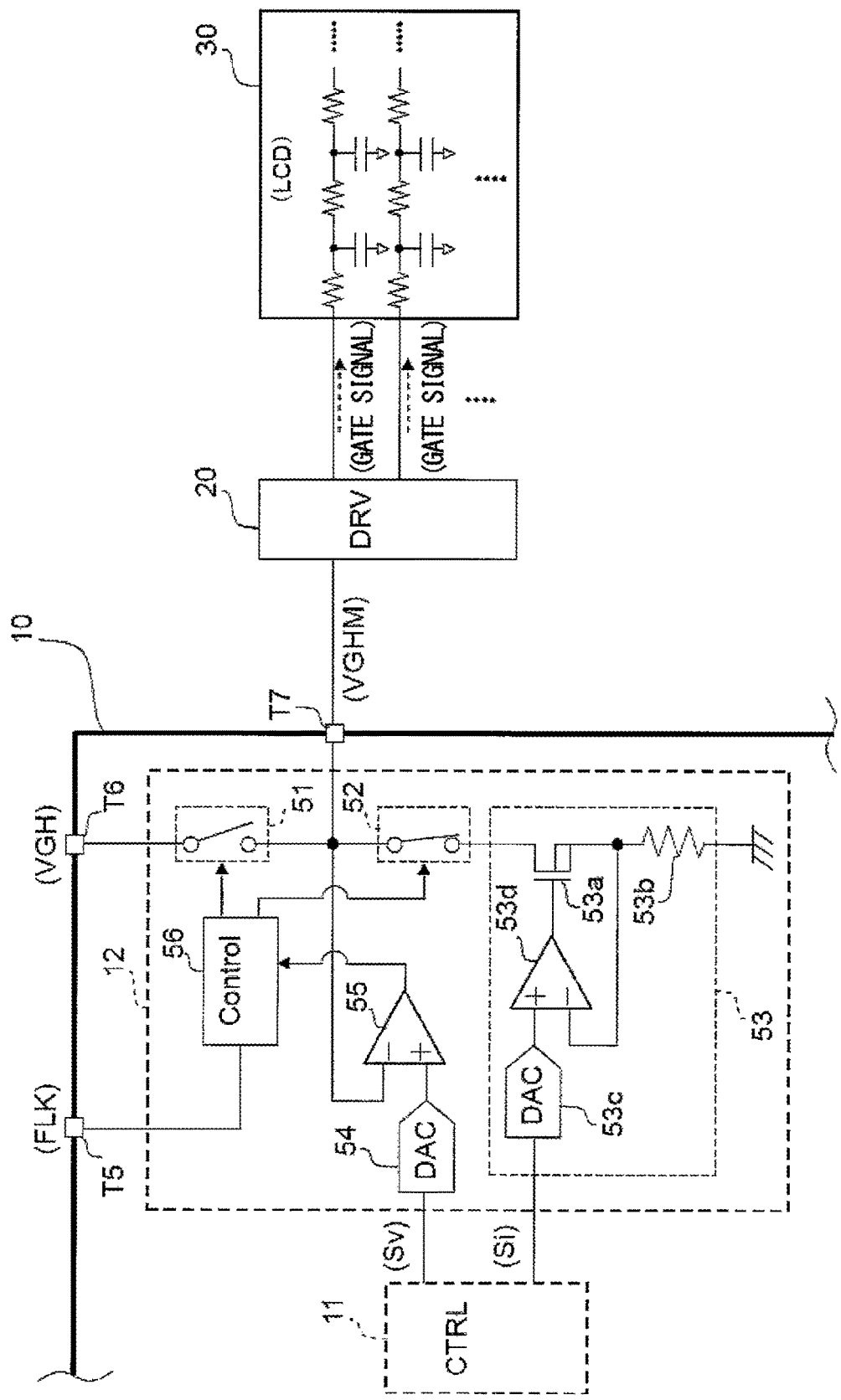
FIG. 11 A diagram showing a first configuration example of a gate pulse modulation portion 12 and its periphery.

The first configuration example of the gate pulse modulation portion 12 will now be described in detail. FIG. 11 is a diagram showing the first configuration example of the gate pulse modulation portion 12 and its periphery. As shown in the figure, the gate pulse modulation portion 12 includes switches (51, 52), a variable current source circuit 53, a DAC (digital to analogue converter) 54, a comparator 55 and a controller 56.

In the switch 51, one end is connected to the external terminal T6, and the other end is connected to one end of the switch 52. The other end of the switch 52 is grounded through the variable current source circuit 53 (a MOSFET 53a and a resistor 53b). The connection node between the switches (51, 52) is connected to the external terminal T7. Each of the switches (51, 52) is formed with, for example, a transistor, and opening and closing across both ends are switched according to an instruction from the controller 56. In the opened state, the continuity between both ends is not achieved; in the closed state, the continuity between both ends is achieved.

The variable current source circuit 53 is a circuit which makes a setting such that the value of a current flowing between the switch 52 and the ground point can be varied. The variable current source circuit 53 includes the MOSFET (switch element) 53a, the resistor 53b, a DAC 53c and an operational amplifier 53d.

In the MOSFET 53a, its drain is connected to the switch 52, and its source is connected to one end of the resistor 53b. The other end of the resistor 53b is grounded. As described above, the resistor 53b is provided between the external terminal T7 and the ground point (low-voltage portion).

In the DAC 53c, its input side is connected to the control portion 11, and its output side is connected to the non-inverting input terminal of the operational amplifier 53d. Information on the discharge control value Si is input from the control portion 11 to the DAC 53c. In the operational amplifier 53d, the inverting input terminal is connected to the connection node between the MOSFET 53a and the resistor 53b, and its output terminal is connected to the gate of the MOSFET 53a. The MOSFET 53a is operated so as to adjust the degree of the continuity between the resistor 53b and the external terminal T7 according to the output signal of the operational amplifier 53d.

In this configuration, the variable current source circuit 53 is operated such that a voltage appearing in the connection node between the MOSFET 53a and the resistor 53b is equal to a voltage value corresponding to the discharge control value Si and that the value of the current flowing from the switch 52 to the ground point is substantially constant. As the discharge control value Si is varied on the side of the control portion 11, the value of the current flowing from the switch 52 to the ground point is varied.

In the DAC 54, its input side is connected to the control portion 11, and its output side is connected to the non-inverting input terminal of the comparator 55. Information on the protection voltage value Sv is input from the control portion 11 to the DAC 54. In the comparator 55, its inverting input terminal is connected to the external terminal T7, and its output terminal is connected to the controller 56.

The controller 56 is connected to the external terminal T5, and controls the switching of the opening and closing of the switches (51, 52) based on the output signals of the modulation control signal FLK and the comparator 55. More specifically, when the modulation control signal FLK is H-level, the controller 56 closes the switch 51 and opens the switch 52 whereas when the modulation control signal FLK is L-level, the controller 56 opens the switch 51 and closes the switch 52. However, when the output signal of the comparator 55 is H-level (when the value of the gate voltage VGHM is less than the protection voltage value Sv), the controller 56 keeps the switch 52 opened regardless of the state of the modulation control signal FLK.

The operation of the gate pulse modulation portion 12 and the like will now be described in more detail. As described above, the controller 56 switches the opening and closing of the switches (51, 52) according to the modulation control signal FLK. When the switch 51 is closed (when the modulation control signal FLK is H-level), the continuity between the external terminal T6 and the external terminal T7 is achieved, and power input from the external terminal T6 is used to perform charge toward the portion (the gate driver 20 or the liquid crystal display panel 30) to which the external terminal T7 is connected. Thus, the gate voltage VGHM is increased so as to be equivalent to the reference gate voltage VGH, and becomes H-level (the state where the TFT of the liquid crystal display panel 30 is turned on).

On the other hand, when the switch 52 is closed (when the modulation control signal FLK is L-level), the continuity between the external terminal T7 and the ground point through the variable current source circuit 53 is achieved, and discharge from the portion (the gate driver 20 or the liquid crystal display panel 30) to which the external terminal T7 is connected toward the ground point is performed. Thus, the gate voltage VGHM is lowered. In this way, the gate voltage VGHM is generated so as to have an approximate pulse waveform.

Here, the current value of the discharge is controlled to be the discharge current value Si by the operation of the variable current source circuit 53. As the discharge control value Si is lower, the discharge is more gently performed. Hence, in the falling portion of the waveform of the gate voltage VGHM, an inclination corresponding to the discharge control value Si is provided.

As described above, when the value of the gate voltage VGHM is lower than the protection voltage value Sv, the controller 56 keeps the switch 52 opened, and the discharge is stopped. Specifically, the controller 56 monitors the gate voltage VGHM, and opens the switch 52 when the gate voltage VGHM reaches the protection voltage value Sv, and achieves the non-continuity between the external terminal T7 and the ground point.

Hence, the protection voltage value Sv becomes the lower limit value of the gate voltage VGHM, and thereby prevents the gate voltage VGHM from being dropped below the protection voltage value Sv. When the value of the gate voltage VGHM is substantially equal to the protection voltage value Sv, the gate voltage VGHM is L-level (the state where the TFT of the liquid crystal display panel 30 is turned off).

Figure 12:
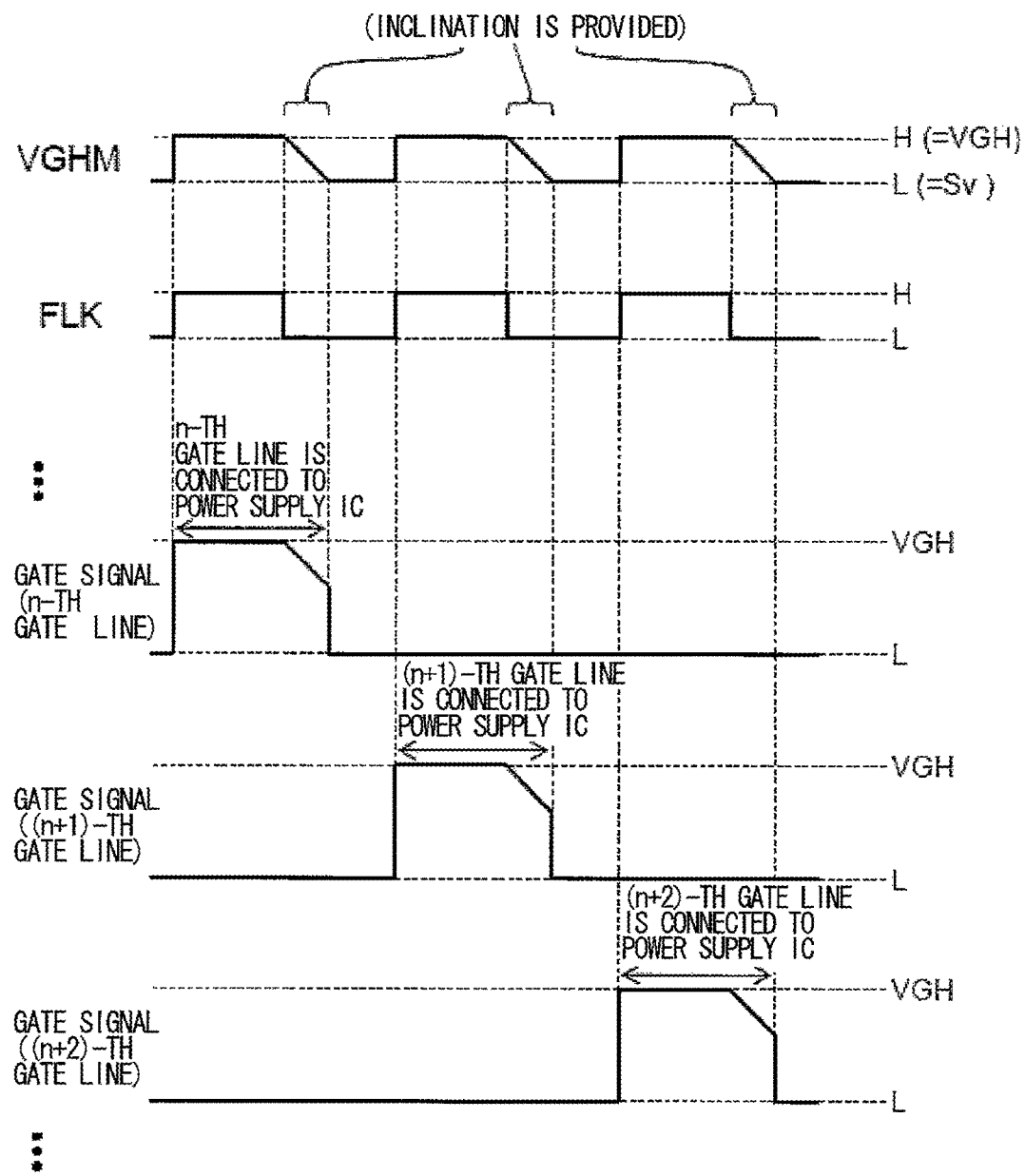

FIG. 12 illustrates a graph of the waveforms of the gate voltage VGHM and the modulation control signal FLK and the waveform of the gate signal generated in the gate driver 20. In the graph, the horizontal axis and the vertical axis represent time and voltage, respectively. The reference gate voltage VGH is modulated by the operation of the gate pulse modulation portion 12 described above, and the gate voltage VGHM of a waveform shown in FIG. 12 is generated.

As shown in FIG. 12, the waveform of the gate voltage VGHM is substantially synchronous with the waveform of the modulation control signal FLK, and is a pulse waveform where the H level and the L level appear alternately, and the H level and the L level are the reference gate voltage VGH and the protection voltage value Sv, respectively.

However, in the falling portion of the waveform of the gate voltage, an inclination corresponding to the discharge control value Si is provided. Thus, the power supply IC 10 achieves the GS function (gate shooting function). Since the discharge control value Si can be changed, the inclination can be adjusted. Hence, with the power supply IC 10, it is possible to adjust the inclination such that the GS function is the most effective according to, for example, the specifications of the liquid crystal display panel 30.

The main features of the power supply IC 10 including the gate pulse modulation portion 12 of the first configuration example in comparison with the conventional example (the power supply IC 100) shown in FIG. 17 will be described below.

Figure 17:
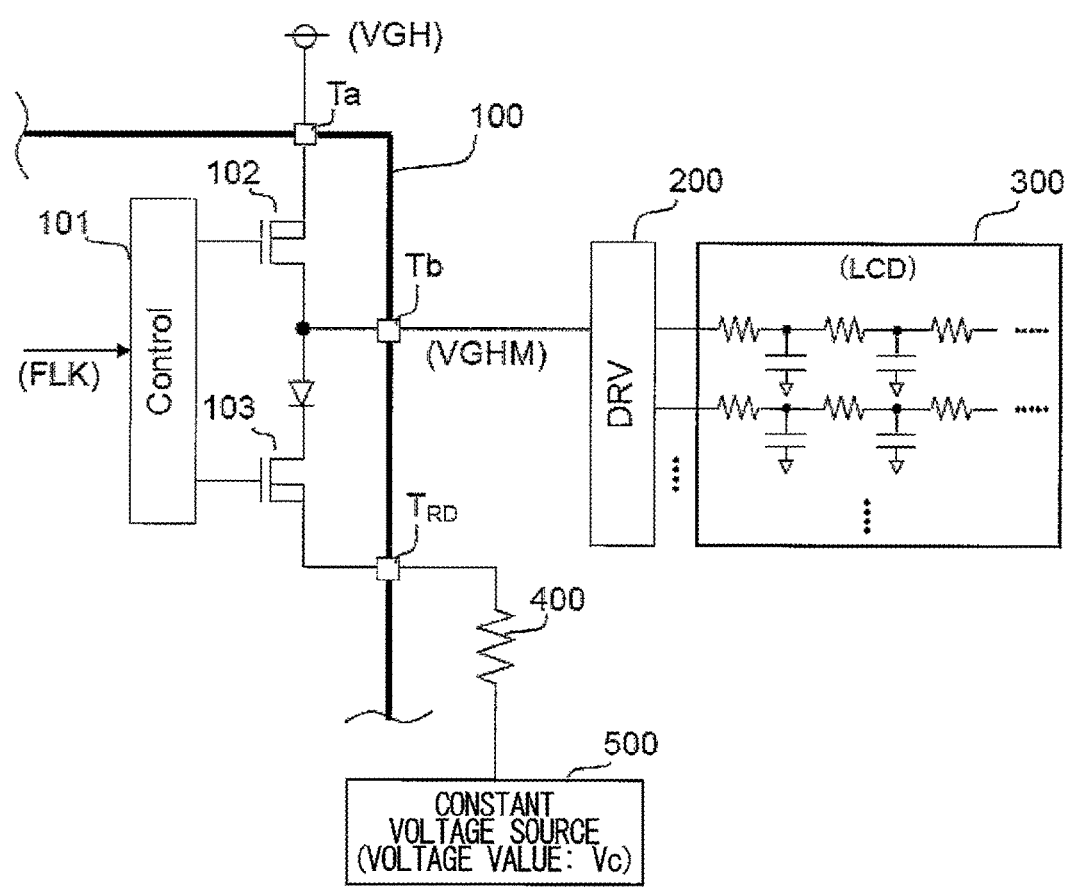
FIG. 17 An illustrative diagram on the configuration of a conventional power supply IC.

The power supply IC 10 including the gate pulse modulation portion 12 of the first configuration example is provided with the variable current source circuit 53 therewithin, and thereby can achieve the GS function without need of an external resistor (corresponding to the external resistor 400 shown in FIG. 17). Hence, with the power supply IC 10, it is possible to reduce the increase in the number of components necessary for the manufacturing of the liquid crystal display device, the manufacturing cost and the like while achieving the GS function.

Since the power supply IC 10 including the gate pulse modulation portion 12 of the first configuration example does not need the connection of an external resistor, it is not necessary to provide an external terminal (corresponding to the external terminal $T_{RD}$ shown in FIG. 17) for the connection of the external resistor. Hence, with the power supply IC 10, it is possible to reduce the increase in the number of external terminals (the number of pins), the manufacturing cost and the like.

Since the power supply IC 10 including the gate pulse modulation portion 12 of the first configuration example controls the switch 52 according to the result of the monitoring of the gate voltage VGHM, it is possible to prevent the gate voltage VGHM from being dropped excessively without need of a constant voltage source (corresponding to the constant voltage source 500 shown in FIG. 17). Hence, with the power supply IC 10, it is possible to reduce the increase in the number of components necessary for the manufacturing of the liquid crystal display device, the manufacturing cost and the like while preventing the gate voltage VGHM from being dropped excessively.

The power supply IC 10 including the gate pulse modulation portion 12 of the first configuration example only updates the setting values of the protection voltage value Sv and the discharge control value Si, and thereby can change the lower limit value of the gate voltage VGHM and the inclination of the falling portion of the waveform. Hence, with the power supply IC 10, it is possible to easily adjust them.

Second Configuration Example

The second configuration example of the gate pulse modulation portion 12 will now be described. The second configuration example is basically equivalent to the first configuration example except that instead of the variable current source circuit, a variable resistance circuit is provided and points related thereto are added. The following description will focus on portions different from the first configuration example, and the description of the same portions as in the first configuration sample may not be repeated.

Figure 13:
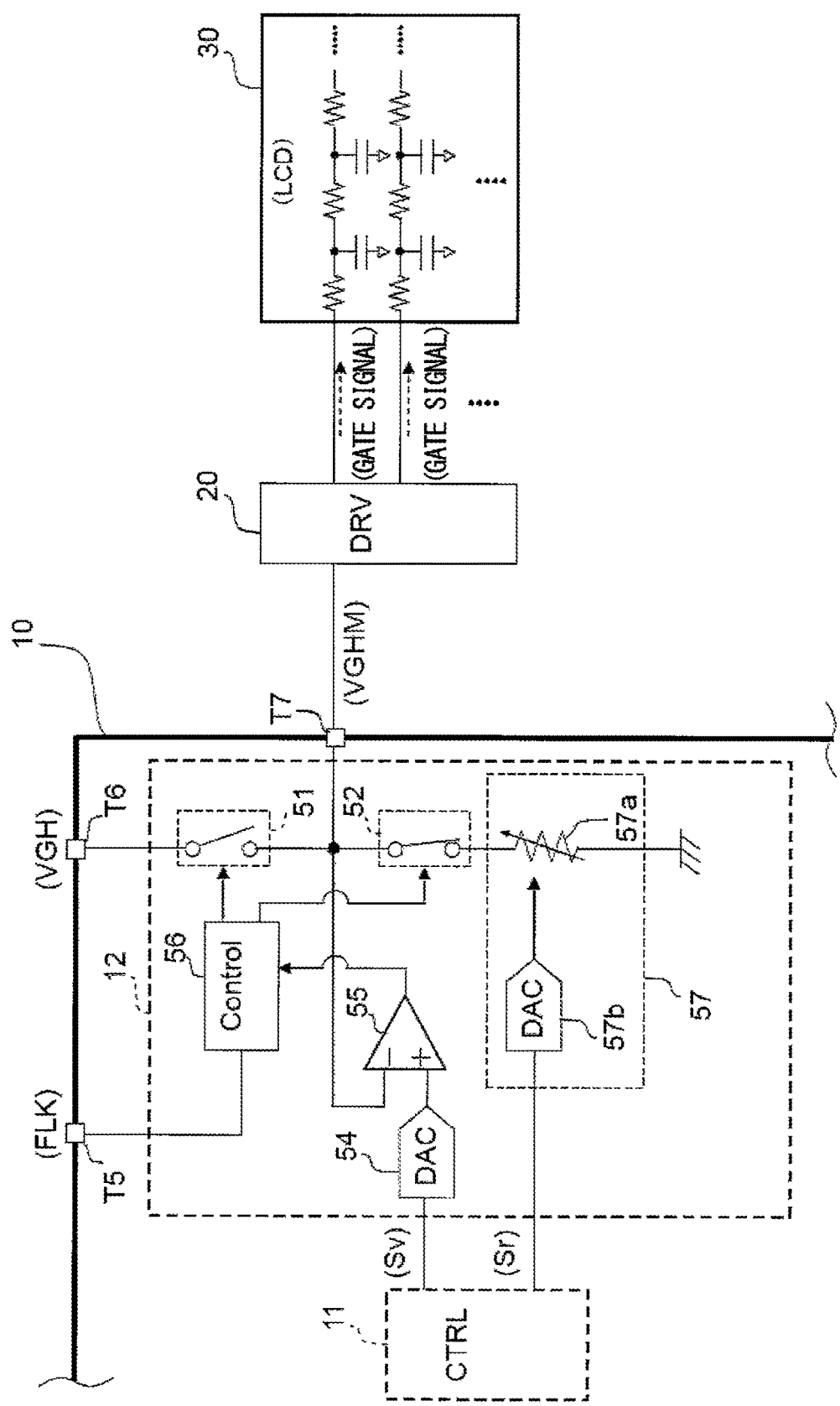
FIG. 13 A diagram showing a second configuration example of the gate pulse modulation portion 12 and its periphery.

FIG. 13 is a diagram showing the second configuration example of the gate pulse modulation portion 12 and its periphery. As shown in the figure, the gate pulse modulation portion 12 includes the switches (51, 52), the DAC 54, the comparator 55, the controller 56 and a variable resistance circuit 57.

The variable resistance circuit 57 includes a variable resistor 57a and a DAC 57b. In the variable resistor 57a, one end is connected to the switch 52, and the other end is grounded. Information on a setting resistance value Sr is input from the control portion 11 to the DAC 57b. The setting resistance value Sr is a value which is set such that it can be varied in the control portion 11 as with the protection voltage value Sv or the like. The resistance value of the variable resistor 57a is set equal to the current setting resistance value Sr based on the output signal of the DAC 57b.

As described above, in the gate pulse modulation portion 12 of the second configuration example, the variable resistor 57a is provided between the external terminal T7 and the ground point. Thus, since the panel capacitor (C) and the variable resistor 57a (R) of the liquid crystal display panel 30 form a CR circuit, the discharge from the portion (the gate driver 20 or the liquid crystal display panel 30) to which the external terminal T7 is connected toward the ground point is performed as CR discharge due to the action of the CR circuit.

Consequently, in the falling portion of the waveform of the gate voltage VGHM, an inclination corresponding to the time constant (determined by the resistance value of the variable resistor 57a or the like) of the CR circuit is provided. This inclination can be adjusted by the change of the resistance value (that is, the setting resistance value Sr) of the variable resistor 57a.

As described above, the variable resistance circuit 57 achieves the function corresponding to the variable current source circuit 53 of the first configuration example. Thus, the power supply IC 10 including the gate pulse modulation portion 12 of the second configuration example also has the same features as the power supply IC 10 including the gate pulse modulation portion 12 of the first configuration example.

Third Configuration Example

The third configuration example of the gate pulse modulation portion 12 will now be described. The third configuration example is basically equivalent to the first configuration example except the main configuration of the gate pulse modulation portion 12 and points related thereto. The following description will focus on portions different from the first configuration example, and the description of the same portions as in the first configuration sample may not be repeated.

Figure 14:
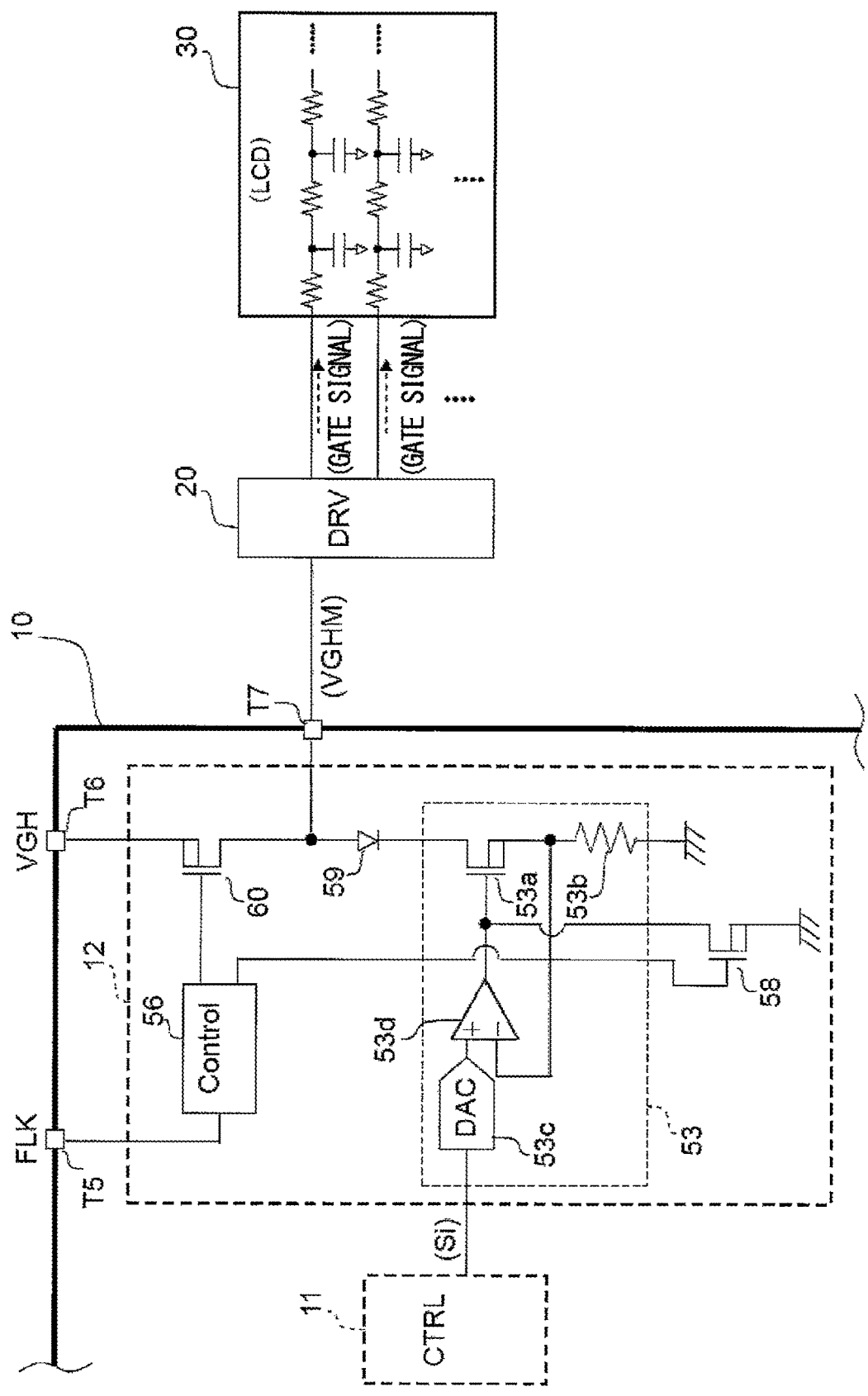
FIG. 14 A diagram showing a third configuration example of the gate pulse modulation portion 12 and its periphery.

FIG. 14 is a diagram showing the third configuration example of the gate pulse modulation portion 12 and its periphery. As shown in the figure, the gate pulse modulation portion 12 of the third configuration example includes the variable current source circuit 53, the controller 56, MOSFETs (58, 60) and a back-flow prevention diode 59. The configuration of the variable current source circuit 53 is equivalent to that of the first configuration example.

In the MOSFET 60, its source is connected to the external terminal T6, and its drain is grounded through the variable current source circuit 53 (the MOSFET 53a and the resistor 53b). Between the MOSFET 60 and the MOSFET 53a, the diode 59 is provided such that the anode is connected to the MOSFET 60. The connection node between the source of the MOSFET 60 and the anode of the diode 59 is connected to the external terminal T7.

In the MOSFET 58, its drain is connected to the connection node between the output end of the operational amplifier 53d and the gate of the MOSFET 53a, and its source is grounded. The gates of the MOSFETs (58, 60) are connected to the controller 56. Thus, in each of the MOSFETs (58, 60), the turning on and off (the continuity and the non-continuity between the source and the drain) are switched according to an instruction from the controller 56.

The controller 56 is connected to the external terminal T5, and controls the switching of the opening and closing of the switches (51, 52) base on the modulation control signal FLK. More specifically, when the modulation control signal FLK is H-level, the controller 56 turns on the MOSFETs (58, 60) whereas when the modulation control signal FLK is L-level, the controller 56 turns off the MOSFETs (58, 60).

In the configuration described above, the gate pulse modulation portion 12 of the third configuration example is operated as follows. When the modulation control signal FLK is H-level, the MOSFET 60 is turned on to achieve the continuity between the external terminal T6 and the external terminal T7, and uses power input from the external terminal T6 to perform charge toward the portion (the gate driver 20 or the liquid crystal display panel 30) to which the external terminal T7 is connected. Thus, the gate voltage VGHM is increased so as to be equivalent to the reference gate voltage VGH and becomes H-level (the state where the TFT of the liquid crystal display panel 30 is turned on). Here, since the MOSFET 58 is on, the MOSFET 53a is off.

On the other hand, when the modulation control signal FLK is L-level, the MOSFET 58 is turned off to achieve the continuity between the external terminal T7 and the ground point through the variable current source circuit 53. Thus, discharge from the portion (the gate driver 20 or the liquid crystal display panel 30) to which the external terminal T7 is connected toward the ground point is performed, and the gate voltage VGHM is lowered. Consequently, the gate voltage VGHM becomes L-level (the state where the TFT of the liquid crystal display panel 30 is turned off).

Here, as in the case of the first configuration example, the current value of the discharge is controlled to be the discharge control value Si by the operation of the variable current source circuit 53. Hence, in the falling portion of the waveform of the gate voltage VGHM, an inclination corresponding to the discharge control value Si is provided. Consequently, the power supply IC 10 can achieve the GS function as in the case of the first configuration example.

Other Configuration Examples

In the circuit configuration of the power supply IC 10 including the gate pulse modulation portion 12 of the first configuration example described above, as compared with the conventional example (see FIG. 17), a monitor circuit (circuit including the DAC 54 and the comparator 55) used for the monitoring of the gate voltage VGHM, the variable current source circuit 53 and the like are added. In this respect, for example, as shown in FIG. 15, without addition of the variable current source circuit 53, the circuit configuration where the monitor circuit is added can be achieved.

Figure 15:
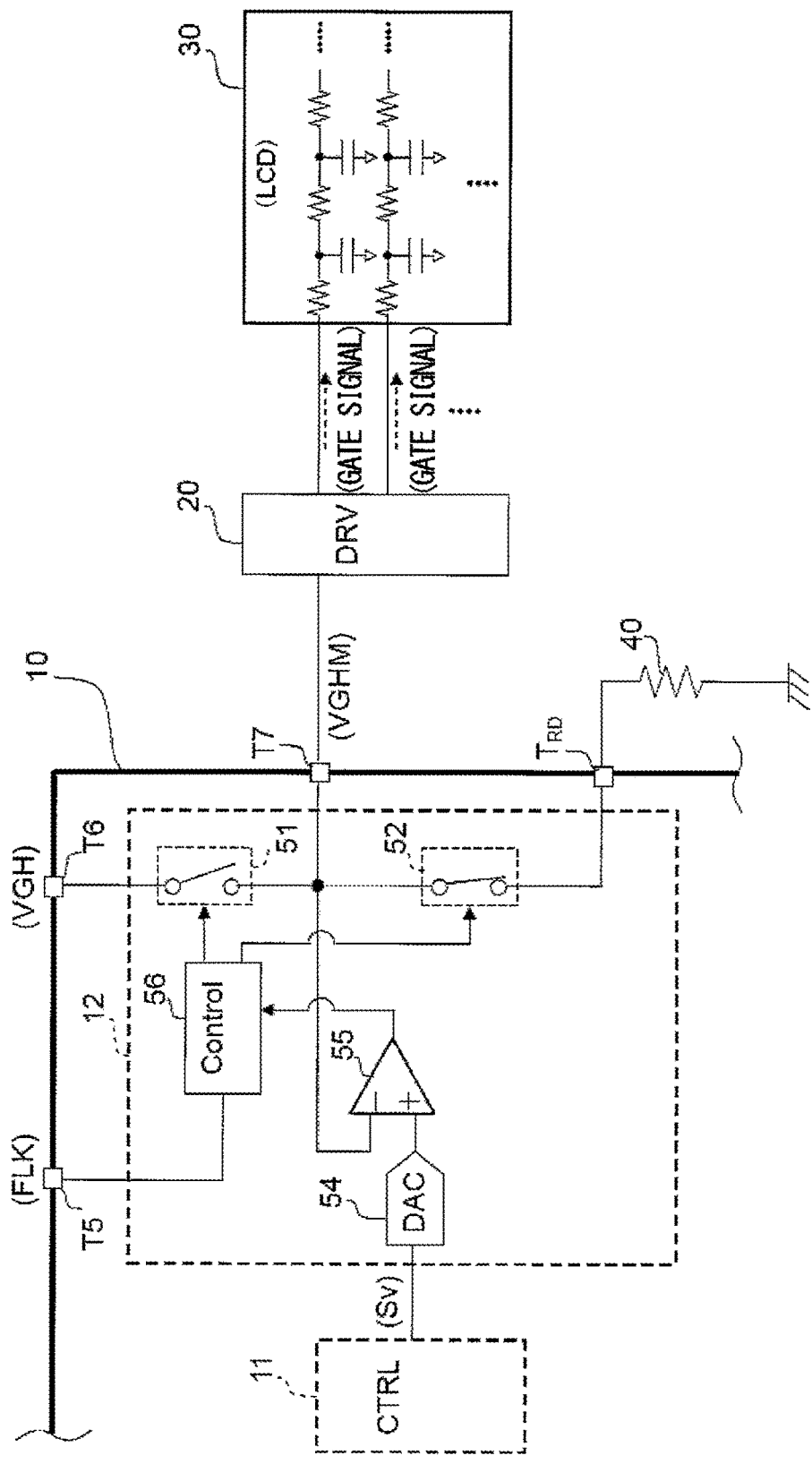
FIG. 15 An illustrative diagram on a circuit configuration where a monitor circuit is provided.

In the circuit configuration shown in FIG. 15, though an external resistor 40 (corresponding to the external resistor 400 shown in FIG. 17) and the external terminal $T_{RD}$ for connecting it are not omitted, without need of a constant voltage source (corresponding to the constant voltage source 500 shown in FIG. 17), the gate voltage VGHM is prevented from being lowered excessively, and in this respect, this is advantageous over the conventional example.

Figure 16:
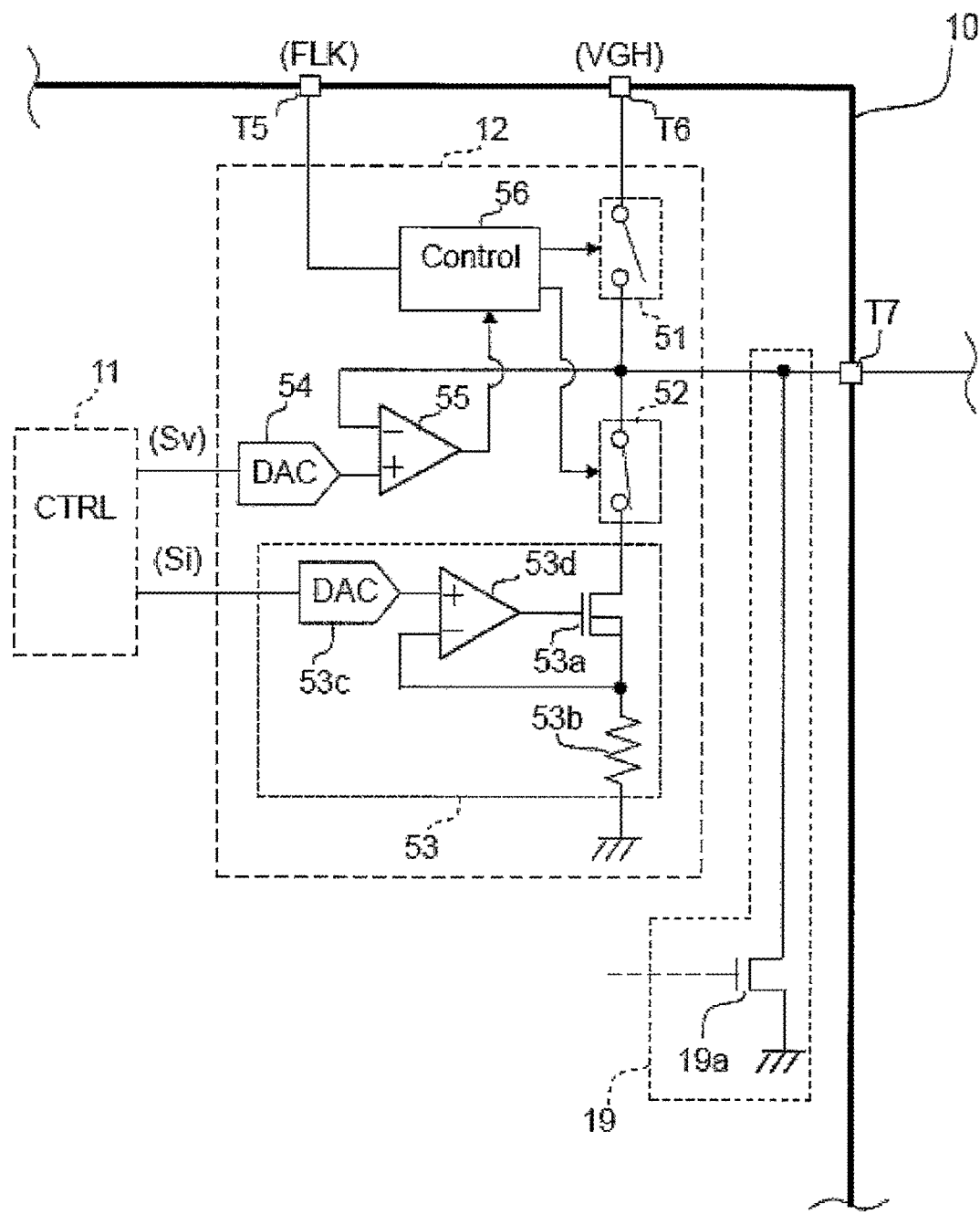
FIG. 16 An illustrative diagram on a ground circuit.

In the circuit configuration of the power supply IC 10 according to the embodiment described above, a rapid discharge circuit that grounds the external terminal T7 according to a predetermined signal (for example, a signal of the result of the monitoring by the voltage reduction protection portion 15 or the temperature protection portion 16) may be provided. FIG. 16 shows, as an example thereof, a circuit configuration in which a rapid discharge circuit 19 is added to the power supply IC 10 including the gate pulse modulation portion 12 of the first configuration example. The rapid discharge circuit 19 includes a MOSFET 19a in which the turning on and off are switched according to a predetermined signal; when the MOSFET 19a is turned on, the rapid discharge circuit 19 grounds the external terminal T7. The rapid discharge circuit 19 grounds the external terminal T7 when, for example, a failure occurs in voltage or temperature, thereby allows rapid discharge to be performed and functions to protect the device.

As described above, the power supply IC 10 is a circuit that supplies the gate voltage VGHM to the gate driver 20 which drives the liquid crystal display panel 30, and is formed as an integrated circuit (IC) where the external terminal 17 connected to the gate driver 20 and the gate pulse modulation portion 12 that generates the gate voltage VGHM of an approximate pulse waveform to output it to the gate driver 20 through the external terminal T7 are provided. Within the integrated circuit, a function portion (inclination provision portion) that provides an inclination to the waveform of the gate voltage VGHM is provided.

With the power supply IC 10, it is possible to supply the gate voltage VGHM to the gate driver 20 while achieving the GS function and also easily reduce the manufacturing cost and the like.

The power supply IC 10 includes the external terminal T6 to which the constant reference gate voltage VGH is input and the low-voltage portion (for example, in the first embodiment, the ground point connected to the resistor 53b) that is set at a voltage lower than the reference gate voltage VGH; the gate pulse modulation portion 12 connects the external terminal T7 to the external terminal T6 to switch the gate voltage VGHM to H-level, and connects the external terminal T7 to the low-voltage portion to switch the gate voltage VGHM to L-level. Thus, the power supply IC 10 modulates the reference gate voltage VGH to generate the gate voltage VGHM.

The inclination provision portion sets, according to a given instruction, the inclination described above such that it can be changed. Specifically, in the cases of the first and third configuration examples, the inclination provision portion is formed with the variable current source circuit 53 that sets, according to the discharge control value Si (the given instruction), the value of the current flowing from the external terminal T7 to the low-voltage portion. On the other hand, in the case of the second configuration example, the inclination provision portion is provided between the external terminal T7 and the low-voltage portion, and is formed with the variable resistor 57a that sets the resistance value according to the setting resistance value Sr (the given instruction). The variable resistor 57a forms the CR circuit together with the panel capacitor included in the liquid crystal display panel 30, and performs the discharge from the liquid crystal display panel 30 to the low-voltage portion as the CR discharge.

<Application to Television Set>

Figure 9:
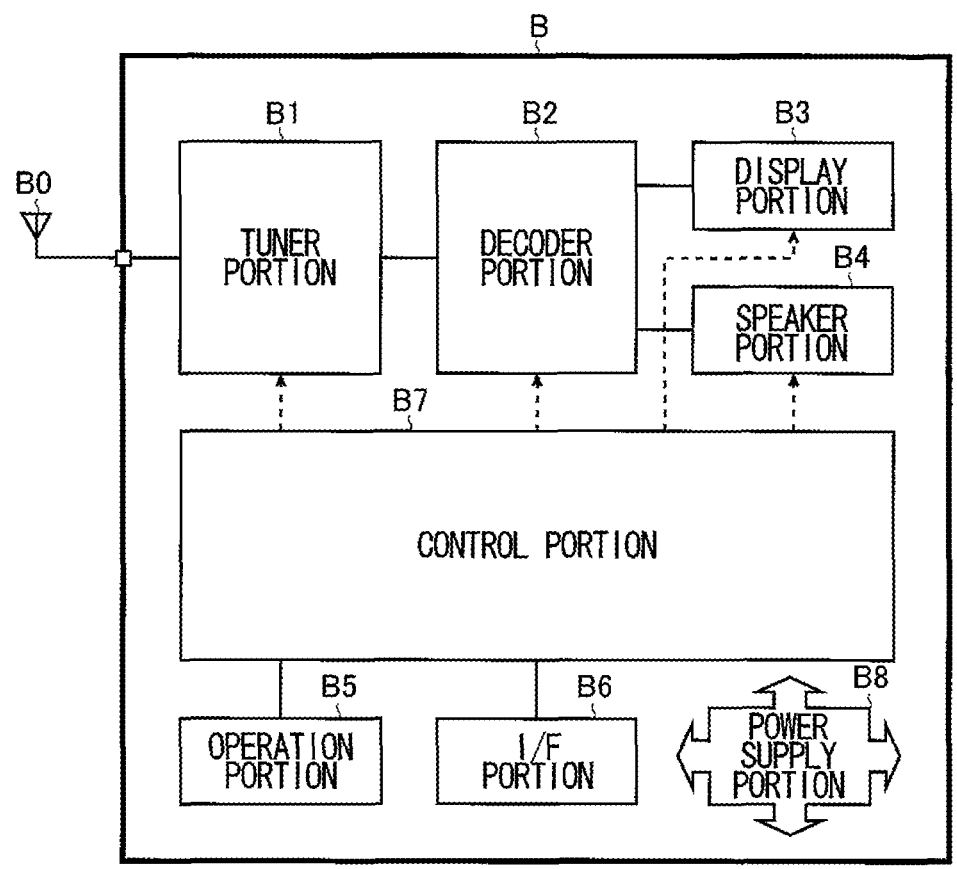
FIG. 9 A block diagram showing an example of the configuration of a television set incorporating the liquid crystal display device 1.
Figure 10A:
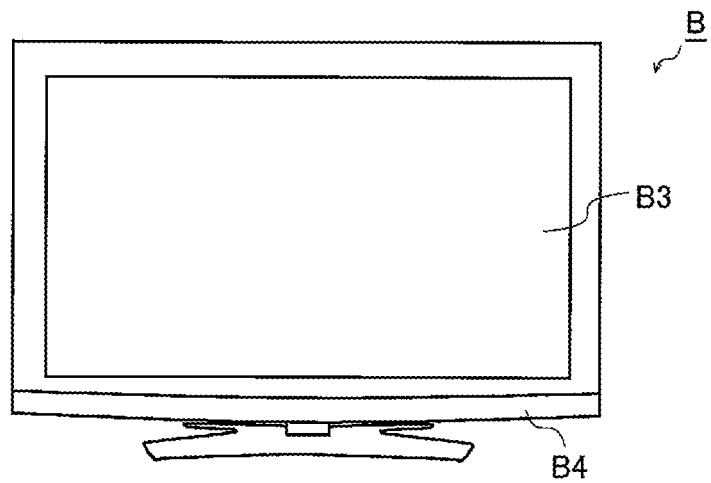
FIG. 10A A front view of the television set incorporating the liquid crystal display device 1.
Figure 10B:
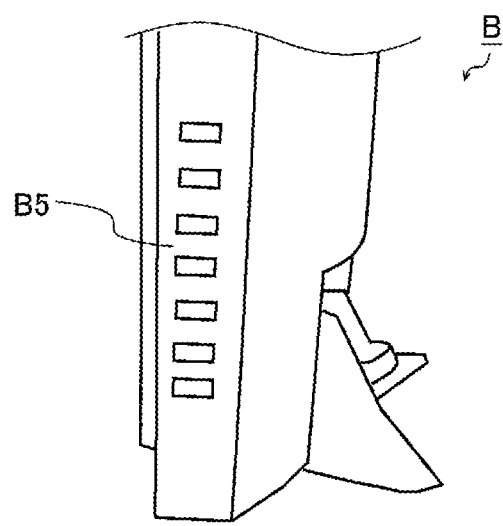
FIG. 10B A side view of the television set incorporating the liquid crystal display device 1.
Figure 10C:
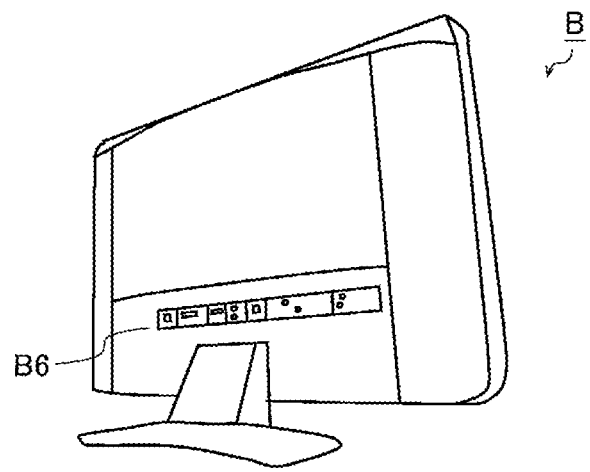
FIG. 10C A back view of the television set incorporating the liquid crystal display device 1.

FIG. 9 is a block diagram showing an example of the configuration of a television set incorporating the liquid crystal display device 1. FIGS. 10A to 10C are respectively a front view, a side view and a back view of the television set incorporating the liquid crystal display device 1. The television set B of the present configuration example includes a tuner portion B1, a decoder portion B2, a display portion B3, a speaker portion B4, an operation portion B5, an interface portion B6, a control portion B7 and a power supply portion B8.

The tuner portion B1 selects the broadcast signal of a desired channel from reception signals received through an antenna B0 externally connected to the television set B.

The decoder portion B2 generates a video signal and a sound signal from the broadcast signal selected by the tuner portion B1. The decoder portion B2 also has the function of generating a video signal and a sound signal based on an external input signal from the interface portion B6.

The display portion B3 outputs, as video, the video signal generated in the decoder portion B2. As the display portion B3, the liquid crystal display device 1 described above can be preferably used.

The speaker portion B4 outputs, as sound, the sound signal generated in the decoder portion B2.

The operation portion B5 is one of the human interfaces that receive the user operation. As the operation portion B5, a button, a switch, a remote controller or the like can be used.

The interface portion B6 is a front end that receives an eternal input signal from an external device (such as an optical disc player or a hard disk drive).

The control portion B7 comprehensively controls the operations of the portions B1 to B6 described above. As the control portion B7, a CPU (central processing unit) or the like can be used.

The power supply portion B8 supplies power to the portions B1 to B7. As the power supply portion B8, the power supply IC 10 described above can be preferably used.

<Other Variations>

In addition to the embodiments described above, in the configurations of the various inventions disclosed in the present specification, various modifications can be made without departing from the spirit of the inventions. For example, the exchange of the bipolar transistor and the MOS field-effect transistor and the logical level inversion of various signals are arbitrarily performed. In other words, it should be considered that the embodiments described above are illustrative in all respects, not restrictive, that the technical scope of the present invention is indicated not by the description of the embodiments described above but by the scope of claims and that meanings equivalent to the scope of claims and all modifications belonging to the scope are included.

INDUSTRIAL APPLICABILITY

The overvoltage protection circuit disclosed in the present specification is a useful technology for enhancing the overvoltage protection in devices such as a table PC (see FIG. 4), a microprocessor, an image processing processor, a multimedia processor, an IP core, a personal computer, a network server, a mobile device, a game machine and a PDA.

The step-up power supply device disclosed in the present specification can be utilized as a power supply for various applications such as a LCD-TV (see FIGS. 9 and 10A to 10C), a PDP-TV, a DVD recorder and a BD recorder.

The power supply circuit disclosed in the present specification can be utilized as, for example, a power supply circuit for a liquid crystal display device (see FIGS. 9 and 10A to 10C).

LIST OF REFERENCE SYMBOLS

1 liquid crystal display device
2 power supply IC (semiconductor device)
11 control portion
12 gate pulse modulation portion (gate voltage generation portion)
13 switching regulator portion
14 overvoltage protection portion (overvoltage protection circuit)
15 voltage reduction protection portion
16 temperature protection portion
17 short protection portion
18 reset portion
19 rapid discharge circuit
19a MOSFET
20 gate driver
30 liquid crystal display panel
40 external resistor
51, 52 switch
53 variable current source circuit
54 DAC
55 comparator
56 controller
57 variable resistance circuit
58, 60 MOSFET
59 diode
L1 coil
D1 diode
C1 capacitor
T1 to T9 external terminal
P1, P2 P-channel MOS field-effect transistor (first transistor, second transistor)
NTr1 NPN bipolar transistor (NPN transistor)
ZD1, ZD2 Zener diode (first Zener diode, second Zener diode)
R1 to R3 resistor (first resistor, second resistor, third resistor)
A electronic device (tablet PC)
A1 image sensing portion
A2 operation portion
A3 display portion
X power supply circuit
X1 N-channel MOS field-effect transistor (output transistor)
X2 switching control portion
X3 air amplifier
X4 digital/analogue converter
X5 oscillator
X6 overvoltage protection portion
X7 overvoltage protection portion
X8, X9 resistor
Y output discharge circuit
Y1 N-channel MOS field-effect transistor (output discharge transistor)
Y2 comparator
Y3 AND gate
Y4 to Y6 resistor
Y7 P-channel MOS field-effect transistor (output discharge transistor)
Y8 level shifter
B television set
B0 antenna
B1 tuner portion
B2 decoder portion
B3 display portion
B4 speaker portion
B5 operation portion
B6 interface portion
B7 control portion
B8 power supply portion

The invention claimed is:

1. An overvoltage protection circuit comprising:
a first P-channel field-effect transistor including a source connected to an input terminal and including a drain connected to an internal circuit;
a first resistor connected between a gate of the first P-channel field-effect transistor and a ground end;
a short circuit operable to short-circuit the source and the gate of the first transistor while an application voltage of the input terminal exceeds a predetermined threshold value; and
a bypass circuit operable to supply a constant voltage from the input terminal to the internal circuit while the voltage of the input terminal exceeds the threshold value,
wherein the short circuit includes:
a second P-channel field-effect transistor including a source connected to the input terminal and including a drain is connected to the gate of the first P-channel field-effect transistor;
a second resistor connected between a gate of the second P-channel field-effect transistor and the input terminal; and
a first Zener diode connected between the gate of the second P-channel field-effect transistor and the ground end,
wherein the bypass circuit includes:
an NPN transistor whose collector is connected to the input terminal and whose emitter is connected to the internal circuit;
a second Zener diode which is connected between a base of the NPN transistor and the ground end; and
a third resistor which is connected between the base of the NPN transistor and the input terminal, and wherein each of the first P-channel field-effect transistor, the second P-channel field-effect transistor and the NPN transistor is high-voltage resistant as compared with an element of the internal circuit.

2. A semiconductor device that integrates the overvoltage protection circuit of claim 1.

3. A liquid crystal display device comprising: the power supply circuit including the semiconductor device of claim 2.

* * * * *